(12) United States Patent
Malik et al.

(10) Patent No.: US 10,753,991 B2
(45) Date of Patent: Aug. 25, 2020

(54) METHOD AND SYSTEM FOR MAGNETIC RESONANCE IMAGING

(71) Applicant: King's College London, London (GB)

(72) Inventors: Shaihan Malik, London (GB); Francesco Padormo, New York, NY (US); Joseph Hajnal, London (GB); Felipe Godinez, London (GB)

(73) Assignee: King's College London, London (GB)

( * ) Notice: Subject to any disclaimer, the term of this patent is extended or adjusted under 35 U.S.C. 154(b) by 4 days.

(21) Appl. No.: 16/093,265

(22) PCT Filed: Apr. 6, 2017

(86) PCT No.: PCT/GB2017/050963
§ 371 (c)(1),
(2) Date: Oct. 12, 2018

(87) PCT Pub. No.: WO2017/178796
PCT Pub. Date: Oct. 19, 2017

(65) Prior Publication Data
US 2019/0128977 A1  May 2, 2019

(30) Foreign Application Priority Data
Apr. 13, 2016 (GB) .................... 1606396.8

(51) Int. Cl.
*G01R 33/28* (2006.01)
*G01R 33/36* (2006.01)
*G01R 33/561* (2006.01)

(52) U.S. Cl.
CPC ......... *G01R 33/288* (2013.01); *G01R 33/286* (2013.01); *G01R 33/287* (2013.01);
(Continued)

(58) Field of Classification Search
CPC .. G01R 33/288; G01R 33/286; G01R 33/287; G01R 33/365; G01R 33/3664; G01R 33/5612
(Continued)

(56) References Cited

U.S. PATENT DOCUMENTS 9,784,807 B2 * 10/2017 Nittka ................ G01R 33/5659
10,156,621 B2 * 12/2018 Zhai ..................... G01R 33/288
(Continued)

FOREIGN PATENT DOCUMENTS

WO   2013/024449 A1   2/2013

OTHER PUBLICATIONS

Etezadi-Amoli, M., Stang, P., Kerr, A., Pauly, J. and Scott, G., 2015. Controlling radiofrequency-induced currents in guidewires using parallel transmit. Magnetic resonance in medicine, 74(6), pp. 1790-1802. (Year: 2015).*
(Continued)

*Primary Examiner* — Christopher P McAndrew
(74) *Attorney, Agent, or Firm* — Banner & Witcoff, Ltd.

(57) ABSTRACT

Parallel transmit Magnetic Resonance MR scanner used to image a conductive object such as an interventional device like a guidewire within a subject. This is achieved by determining which Radio Frequency RF transmission modes produced by the parallel RF transmission elements couple with the conductive object and then transmitting at significantly reduced power so as to prevent excessive heating of the conductive object to an extent that would damage the surrounding tissue of the subject, for example, the coupling RF transmission modes may be generated at less than 30%, preferably around 10% of the normal power levels that would conventionally be used for MR imaging. However, even at these low power levels sufficient electric currents are induced in the conductive device to cause detectable MR
(Continued)

signals; the location of the conductive object within the subject can thus be visualised. By fast alternate, or simultaneous, iterative application of low-power coupling mode and normal-power non-coupling modes, both the subject and the conductive object can be imaged. During the calibration step of determining which RF transmission modes couples with the conductive object, instead of physically measuring the current induced in the conductive object using sensors, imaging the conductive object using additional very short series of flip angle RF pulses (vLFA) gives a good approximation of the coupling matrix.

16 Claims, 13 Drawing Sheets

(52) U.S. Cl.
CPC ....... *G01R 33/365* (2013.01); *G01R 33/3664* (2013.01); *G01R 33/5612* (2013.01)

(58) Field of Classification Search
USPC .......................................................... 324/309
See application file for complete search history.

(56) References Cited

U.S. PATENT DOCUMENTS

| | | | |
|---|---|---|---|
| 2009/0108844 A1 | 4/2009 | Sodickson et al. | |
| 2010/0237869 A1 | 9/2010 | Griswold et al. | |
| 2013/0002249 A1* | 1/2013 | Wald .................... | G01R 33/288 324/309 |
| 2014/0210472 A1* | 7/2014 | Homann ................ | G01R 33/36 324/309 |
| 2014/0340084 A1* | 11/2014 | Alon ....................... | A61B 5/01 324/309 |
| 2015/0253393 A1* | 9/2015 | Harvey ................. | G01R 33/561 324/322 |
| 2015/0309132 A1* | 10/2015 | Brown ............. | G01R 33/34084 324/307 |
| 2017/0234945 A1* | 8/2017 | Findeklee ............ | G01R 33/385 324/313 |

OTHER PUBLICATIONS

Yip, C.Y., Fessler, J.A. and Noll, D.C., 2005. Iterative RF pulse design for multidimensional, small-tip-angle selective excitation. Magnetic Resonance in Medicine: An Official Journal of the International Society for Magnetic Resonance in Medicine, 54(4), pp. 908-917. (Year: 2005).*
Van den Bosch—New method to monitor RF safety in MRI-guided interventions based on RF induced image artefacts. Medical Physics. 2010.
Griffin, G. H., Anderson, K. J. T., Celik, H., & Wright, G. A. (2015). Safely assessing radiofrequency heating potential of conductive devices using image-based current measurements. Magnetic Resonance in Medicine.
ASTM standard F 2182-2002a. Standard test method for measurement of radio frequency induced heating near passive implants during magnetic resonance imaging.
Oct. 21, 2016—(GB) Search Report—Application No. GB1606396. 8.
Konings MK, Bartels LW, Smits HFM, Bakker CJG. "Heating Around Intravascular Guidewires by Resonating RF Waves"—J. Magn. Reson. Imaging 2000;12:79-85. doi: 10.1002/1522-2586(200007)12:1<79::AID-JMRI9>3.0.CO;2-T.
Maryam Etezadi-Amoli et al—"Controlling radiofrequency-induced currents in guidewires using parallel transmit: Controlling RF Current Using Parallel Transmit". Magnetic Resonance in Medicine. Dec. 17, 2015, vol. 74, No. 6.
Gudino N, Sonmez M, Yao Z, et al. Parallel transmit excitation at 1.5 T based on the minimization of a driving function for device heating. Med. Phys. 2015;42:359-371. doi: 10.1118/1.4903894.
McElcheran CE, Yang B, Anderson KJT, Golenstani-Rad L, Graham SJ. Investigation of Parallel Radiofrequency Transmission for the Reduction of Heating in Long Conductive Leads in 3 Tesla Magnetic Resonance Imaging. PLoS ONE 2015;10:e0134379. doi: 10.1371/journal.pone.0134379.
Vernickel P. Röschmann P, Findeklee C, Lüdeke K-m, Leussler C, Overweg J, Katscher U, Grässlin I, Schünemann K. Eight-channel transmit/receive body MRI coil at 3T. Magn. Reson. Med. 2007;58:381-389. doi: 10.1002/mrm.21294.
Yamykh VL. Actual flip-angle imaging in the pulsed steady state: A method for rapid three-dimensional mapping of the transmitted radiofrequency field. Magn. Reson. Med. 2007;57:192-200. doi: 10.1002/mrm.21120.
Nehrke K. On the steady-state properties of actual flip angle imaging (AFI). Magn. Reson. Med. 2009;61:84-92. doi: 10.1002/mrm.21592.
Van de Moortele PF, Snyder C, DelaBarre L, Adriany G, Vaughan J, Ugurbil K Calibration tools for RF shim at very high field with multiple element RF coils: from ultra fast local relative phase to absolute magnitude B1+ mapping. In: Proceedings of the Joint Annual Meeting ISMRM-ESMRMB. Berlin, Germany; 2007. p. 1676.
Overall WR, Pauly JM, Stang PP, Scott GC. Ensuring safety of implanted devices under MRI using reversed RF polarization. Magn. Reson. Med. 2010;64:823-833. doi: 10.1002/mrm.22468.
Padormo F, Hess AT, Aljabar P, Malik SJ, Jezzard P, Robson MD, Hajnal JV & Koopmans PJ. Large Dynamic Range Relative B1+ Mapping. Magn. Reson. Med. 2016; 76:490-499 doi:10.1002/mrm. 25884.
Nitz WR, Oppelt A, Renz W, Manke C, Lenhart M, Link J. On the heating of linear conductive structures as guide wires and catheters in interventional MRI. J Magn Reson Imaging. 2001;13(1):105-114. doi:10.1002/1522-2586(200101) 13:1<105::AID-JMRI1016>3.0. CO;2-0.
Park SM, Kamondetdacha R, Nyenhuis JA. Calculation of MRI-induced heating of an implanted medical lead wire with an electric field transfer function. J Magn Reson Imaging. 2007;26(5):1278-1285. doi:10.1002/jmri.21159.
Etezadi-Amoli M, Stang P, Kerr A, Pauly J, Scott G. Interventional device visualization with toroidal transceiver and optically coupled current sensor for radiofrequency safety monitoring. Magn Reson Med. 2015;73(3):1315-1327. doi:10.1002/mrm.25187.
Aug. 17, 2017—International Search Report and Written Opinion for PCT/GB2017/050963.

* cited by examiner

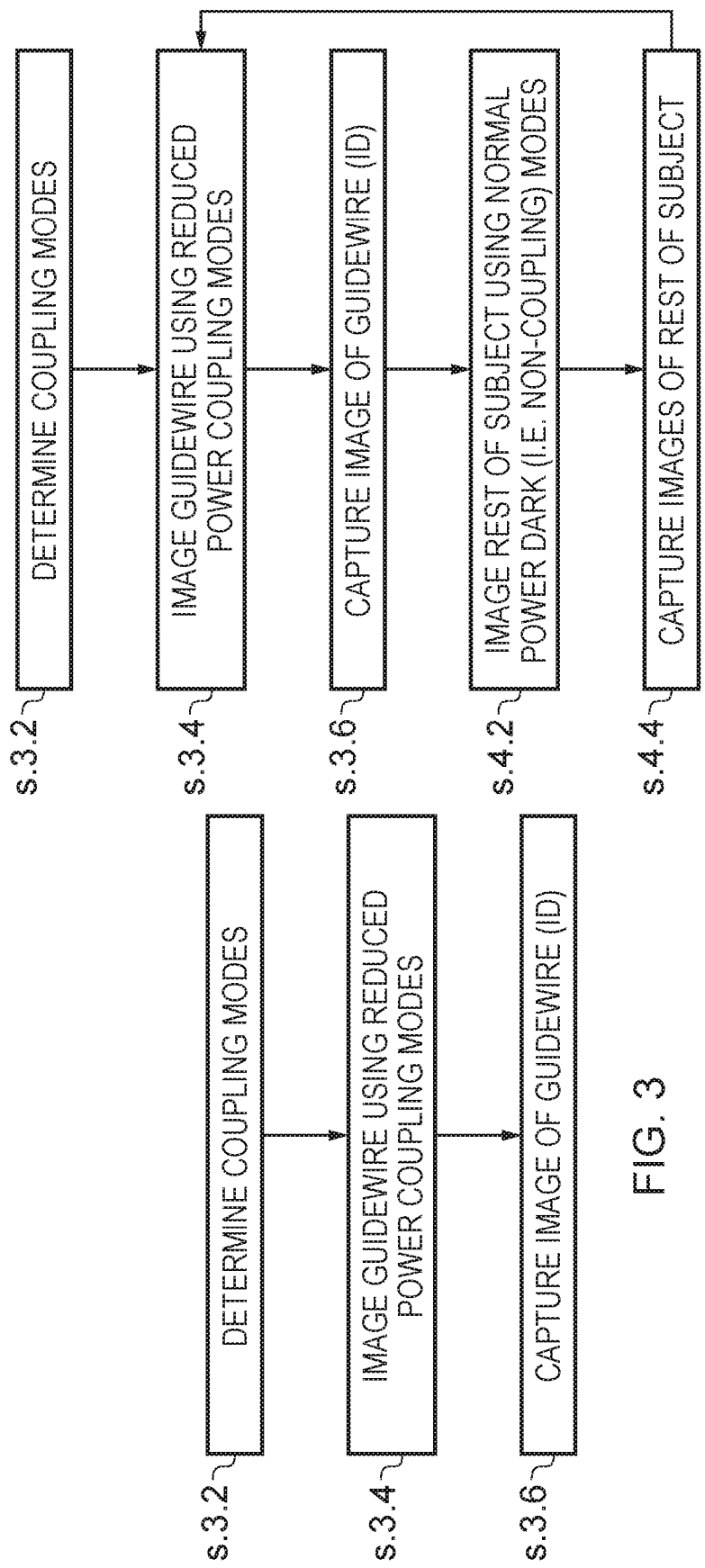

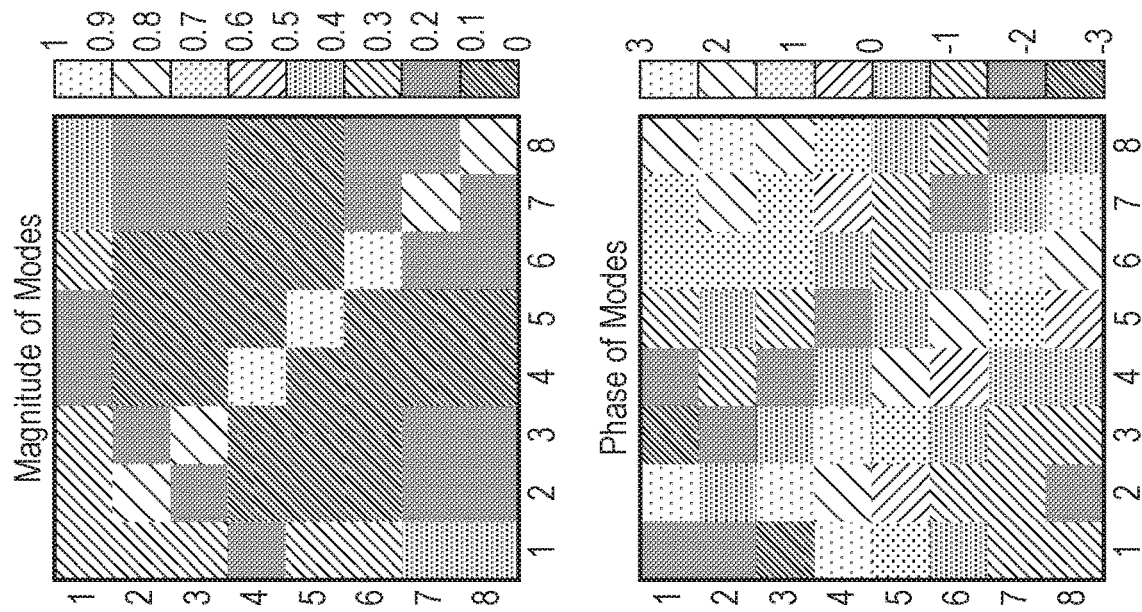
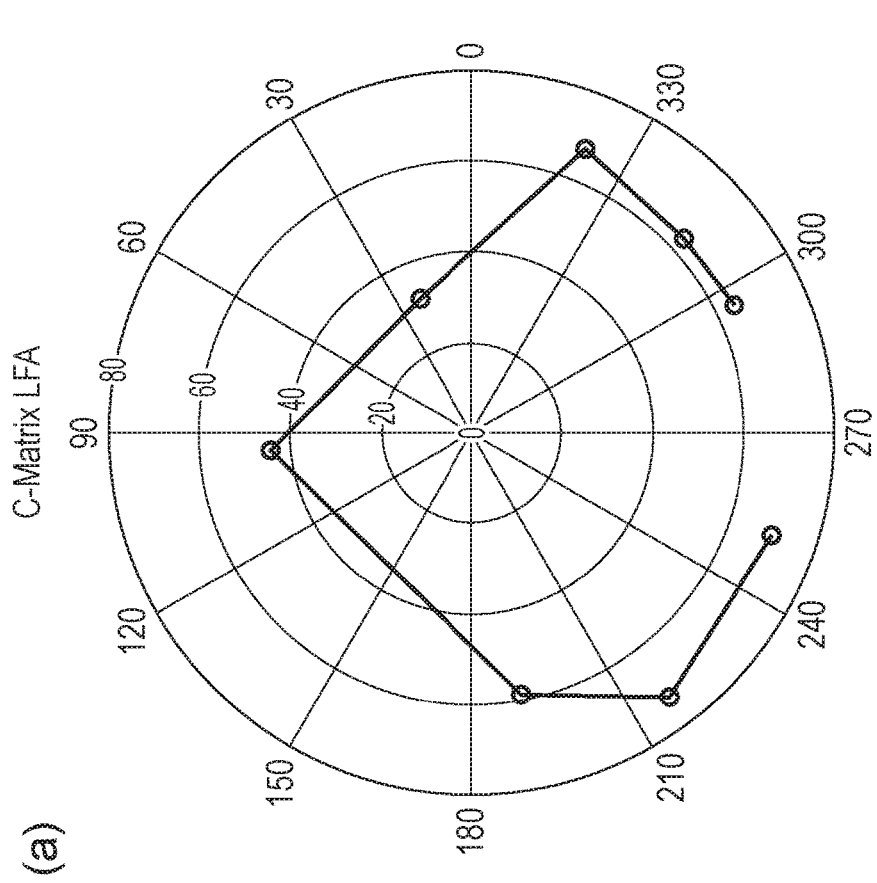
FIG. 12

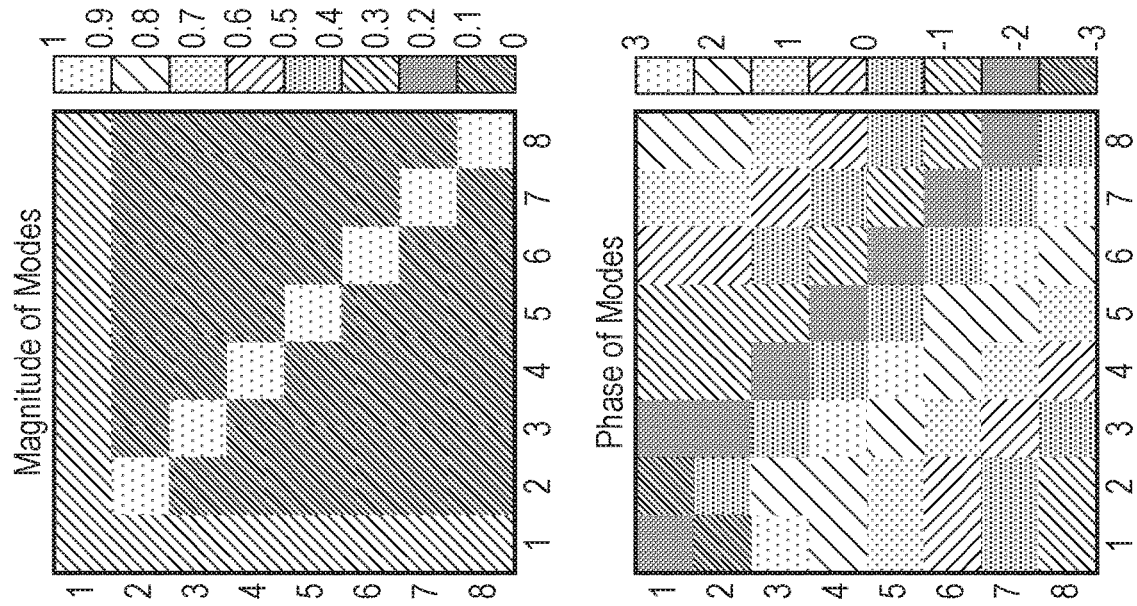
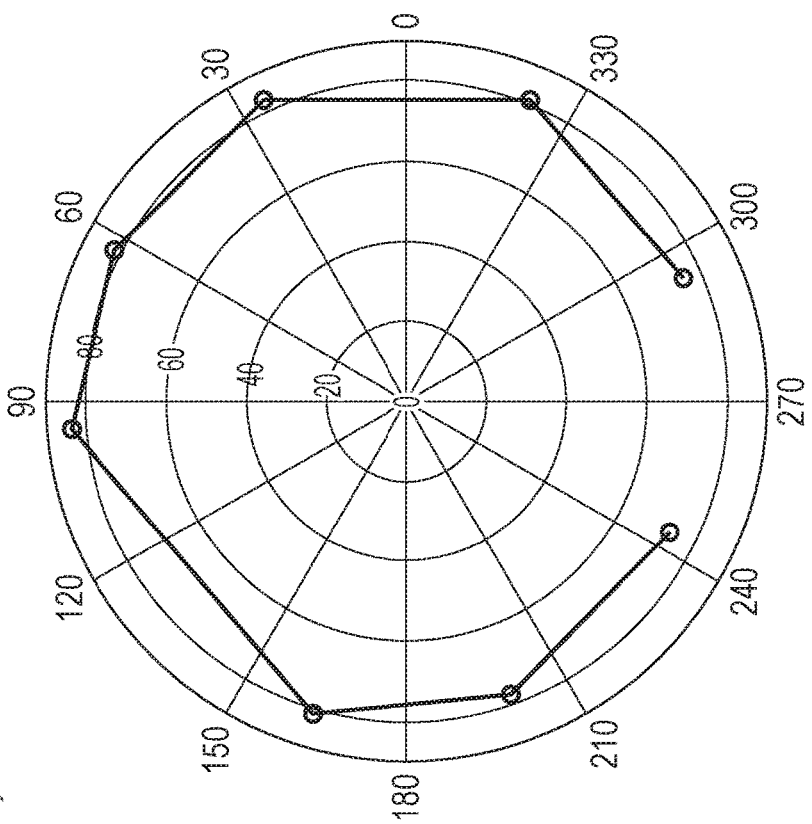
FIG. 12 (Continued)

METHOD AND SYSTEM FOR MAGNETIC RESONANCE IMAGING

CROSS-REFERENCE TO RELATED APPLICATIONS

This application is a U.S. National Stage application under 35 U.S.C. § 371 of International Application PCT/GB2017/050963 (published as WO2017/178796), filed Apr. 6, 2017, which claims the benefit of priority to United Kingdom Application GB 1606396.8 filed Apr. 13, 2016. Benefit of the filing date of each of these prior applications is hereby claimed. Each of these prior applications is hereby incorporated by reference in its entirety.

TECHNICAL FIELD

The present invention relates to a method and system for magnetic resonance (MR) imaging, and in some embodiments a method and system for MR imaging using multiple transmit coils where the transmission modes generated by the transmit coils are controlled so as to couple to a small degree with a conductive object present within a subject to be imaged, to thereby allow visualisation of the object position.

BACKGROUND TO THE INVENTION

Cardiac catheterisation is a minimally invasive clinical procedure in which tubes or thin wires are inserted into the patient's cardiovascular system via a peripheral blood vessel in order to treat and diagnose a wide range of conditions. Standard practice employs x-ray fluoroscopy to guide placement of the devices. However, this results in a large radiation dose and hindered device navigation as x-ray images have poor tissue contrast and are two-dimensional in nature.

MRI guidance of interventional procedures (iMRI) is an appealing alternative due to improved tissue visualisation and zero deposition of ionising radiation. However, two primary challenges remain.

Firstly, the radiofrequency electromagnetic fields used in MRI can induce currents on any conductive devices, such as guidewires and braided catheters. This can result in high focal heating, posing a risk to patients. Many solutions have been proposed. Fibreglass guidewires eliminate the risk, but suffer from reduced mechanical performance and can shatter. Another approach alters the architecture of interventional devices, changing their electromagnetic behaviour in order to ensure the radiofrequency fields cannot be absorbed. This approach also results in compromised mechanical properties. A final approach is to harness parallel transmission, an alternative MRI system architecture which enables enhanced control of radiofrequency fields. It is possible to create fields with the express purpose of minimising induced currents, informed either by electromagnetic simulations or monitoring currents on the device outside of the patient.

The second hurdle to be overcome is device localisation in order to enable navigation to the correct location. Several solutions have been proposed. Passive and active markers have been placed on devices to impart distinctive trackable 'footprints' in the MRI image. However this approach is not always robust due to variations in the background MRI signals. Another approach is to alter the image acquisition to sensitise the image to perturbations in the magnetic field caused by the device. However this strategy is dependent on the device having specific orientations in relation to the MRI magnet. Another strategy adds circuitry to devices to either embed or make the entire device act as an MRI receive antenna. This again can result in heating and results in non-standard guidewires. The final employed strategy embeds miniature resonant coils on devices, designed to perturb the radiofrequency field in order to create hyper-intense fields in their vicinity. This results in device visibility due to signal enhancement. This method has been further refined by tailoring the RF fields of multi-channel coils (such as those used for parallel transmission) in order to either maximise its measurement sensitivity to the marker signal, or to minimise the transmit field in the vicinity of the wire, so the images are only sensitive to signals produced by the marker.

PRIOR ART

As noted above, embodiments of the invention to be described herein relate to the field of Magnetic Resonance Imaging (MRI), but more specifically to interventional MRI (iMRI). Interventional MRI is the method of performing surgical changes to or taking physiological readings from the internal anatomy of a patient by guiding the appropriate device from the patient's exterior to the desired internal location. An example of the technique is the insertion of a pressure monitor into the aorta in order to measure blood pressure throughout the cardiac cycle.

More specifically, embodiments of the invention to be described later relate to a MRI hardware system used for iMRI which makes use of multiple transmit coils for simultaneous RF transmission to generate multiple RF transmit modes. The general system architecture, shown in FIG. 1, consists of a main magnet (either permanent, resistive or superconducting, indicated by 1) whose purpose is to create a polarising magnetic field (directed in the Z direction by convention) which aligns the nuclear spins (typically protons in Hydrogen nuclei) present in the patient (indicated by 2), and gradient coils (not shown) which are used to change the strength of the Z-directed magnetic field in space in order to spatially localise signal to create images. Multiple (total number denoted by N) radiofrequency antennas (indicated by 3) are present in the magnet, whose purpose is to produce in the patient a magnetic field (known as the transmit field), which oscillates at the resonant frequency of the nuclear spins and is oriented perpendicular to the Z direction. The multiple transmitters are controlled by the Transmit Control System (indicted by 4), which provides each transmitter with an oscillating voltage waveform with a specified voltage and phase that may be time varying. In this invention, identical waveforms are supplied to each transmitter, but each is modified by a complex scaling factor (i.e. both amplitude and phase are modified). The set of scaling factors applied to the transmitters are referred to as 'RF Shims', and are denoted by the N×1 vector w, where the $j^{th}$ element of w specifies the scaling factor applied to the $j^{th}$ transmitter.

This radiofrequency transmit field perturbs the nuclear spins, which then radiate signals. These signals are measured by radiofrequency antennas, which can be those which generated the transmit field (3) but operating in receive mode, or alternative dedicated receivers (not shown). The measured signals are then processed by a dedicated computer to form images (not shown).

The interventional device (ID, indicated by 5, and presumed to be electrically conductive in this patent, for example a guidewire) is partially inserted into the patient. Radiofrequency electric currents may be induced on the ID when the patient is exposed to the transmit field, which in turn can result in focal heating, potentially causing injury to the patient.

Etezadi-Amoli et. al. (Magnetic Resonance in Medicine (2015) 74(6):1790-1802, doi:10.1002/mrm.25543) proposed a method to enable iMRI scanning with reduced currents on the ID, using a parallel transmit MRI system architecture as described above. More specifically, in the Etezadi-Amoli arrangement, the ID is instrumented with M currents sensors (CS, indicated by 6) at several positions along its exposed section. Each CS is connected to the current sensor measurement device (indicated by 7), which measures the amplitude and phase of the current whilst the transmit field is being applied. CS measurements can also be synthesized from MRI image data and used equivalently in the process outlined below.

In the Etezadi-Amoli method the following calibration procedure is then first performed. Each transmitter (3) is individually energised, and current readings are concurrently measured on each CS. This results in a set of M×N current readings, denoted by $c_{i,j}$ where the index i indicates the current sensor used to obtain the measurement and j denotes the energised transmitter of the measurement. Each $c_{i,j}$ is a complex number, whose amplitude gives the amplitude of the current and whose angle gives the phase of the oscillating current. These measurement are then passed to the Transmit Modes Calculator (indicated by 8), which first arranges the measurements into the matrix C, given by equation 1, and is referred to as the Calibration matrix.

$$C = \begin{pmatrix} c_{1,1} & c_{1,2} & \cdots & c_{1,N} \\ c_{2,1} & c_{2,2} & & c_{2,N} \\ \vdots & & \ddots & \vdots \\ c_{M,1} & c_{M,2} & \cdots & c_{M,N} \end{pmatrix} \quad [1]$$

The Transmit Mode Calculator then performs a Singular Value Decomposition on the Calibration matrix C, obtaining three further matrices, denoted by U, S and V, as given by equation 2.

$$\operatorname{svd}(C) = [U, S, V] \quad [2]$$

Each column of the N×N complex matrix V is an N×1 vector $m_a$ (index a=1, 2, . . . , N), referred to as a 'mode', each has a corresponding singular value $s_a$, obtained from the appropriate diagonal element of the matrix S. The N modes can be classified into two groups.

The first group contains M 'coupled modes' $c_k$ (index k=1, 2, . . . , M), which can be identified by the fact that their singular values are non-zero (i.e. $s_k>0$). When the RF shim applied by the Transmit Control System is linear combination of coupled modes (i.e. $w_{CM} = \beta_1 m_1 + \beta_2 m_2 + \ldots + \beta_M m_M$, where $\beta_1, \beta_2, \ldots, \beta_M$ are complex scaling factors), currents are induced on the wire. These modes conventionally are discarded, as they can induce currents and can cause heating.

The second group contains (N-M) 'decoupled modes' $d_l$ (index l=1, 2, . . . , N-M). These have singular values of zero (i.e. $s_l=0$). When the RF shim applied by the Transmit Control System is formed of a linear combination of decoupled modes (i.e. $w_{DM} = \gamma_1 d_1 + \gamma_2 d_2 + \ldots + \gamma_{(N-M)} d_{(N-M)}$, where $\gamma_1, \gamma_2, \ldots, \gamma_{(N-M)}$ are complex scaling factors), no currents are induced on the wire.

In summary, therefore, within the Etezadi-Amoli system outlined above, the "decoupled modes" i.e. RF transmit modes that do not couple into the conductive guidewire, are determined as described above, and then the determined decoupled modes are subsequently used for safe iMRI scanning. As a consequence, the guidewire is not imaged, and little or no heating of the guidewire occurs.

SUMMARY OF THE INVENTION

Embodiments of the invention relate to a parallel transmit MR scanner and associated method of operation thereof, which is used to image a conductive object such as an interventional device like a guidewire within a subject. This is achieved by determining which RF transmission modes that can be produced by the parallel RF transmission elements couple with the conductive object when within the subject, and then transmitting these RF transmission modes at significantly reduced power so as to prevent excessive heating of the conductive object to an extent that would damage the surrounding tissue of the subject. For example, the coupling RF transmission modes be generated at less than 30% and preferably around 10% of the normal power levels that would conventionally be used for MR imaging. However, even at these low power levels sufficient electric currents are induced in the conductive interventional device to allow localised magnetic fields to be induced immediately around the surface of the conductive object, the localised magnetic fields being sufficient to cause detectable MR signals to be generated from around the conductive object which can be detected by the MR scanner. The result is that the location of the conductive object within the subject can be visualised, by virtue of the localised MR signals from around the object.

In further embodiments the reduced or low power coupling modes that effectively image the conductive object can be interleaved with conventional non-coupling modes at the normal power level, to allow the subject per se to be imaged. In this way, alternate imaging of both the conductive object and the subject is obtained, which images may be combined together to provide a composite or otherwise combined image showing both the tissue of the subject and the conductive object. The conductive object may be a surgical interventional device, such as a guidewire or the like, for example for a catheter.

In view of the above, from one aspect the present invention provides a method of imaging a conductive object with a parallel transmit MR scanner apparatus, comprising: a) determining one or more RF transmit modes that couple with a conductive object located within a subject to be imaged; and b) imaging the conductive object within the subject by controlling the parallel transmit MR scanner to produce the determined one or more coupling RF transmit modes at a reduced power than normal.

For example, in one embodiment the reduced power is sufficiently reduced so as to prevent excessive heating of the conductive object by the coupling RF transmit modes. Alternatively or additionally, the reduced power is sufficiently reduced so as to prevent heating of the conductive object by the coupling RF transmit modes to a level that would cause damage to the tissue of the subject surrounding the conductive object.

In numerical terms, the RF transmit power of the determined coupling modes may be 30% or less of the normal imaging signal transmit power, or more preferably 20% or less of the normal imaging signal transmit power, or even more preferably between 5% and 15% of the normal imaging signal transmit power, or most preferably around 10% of the normal imaging signal transmit power. Alternatively, the RF transmit power of the determined coupling modes may be 5% or less of the normal imaging signal transmit power, or more preferably around 1% of the normal imaging signal transmit power, or more preferably 1% or less of the normal imaging signal transmit power.

In embodiments of the invention the coupling RF modes induce electric currents in the conductive object which in turn induce localised magnetic fields around the conductive object, the localised magnetic fields generating, when the MR scanner apparatus is operating, a detectable MR signal local to the conductive object.

In some further embodiments the method further comprises: c) determining one or more RF transmit modes that do not couple with the conductive object located within the subject to be imaged; and d) imaging the subject by controlling the parallel transmit MR scanner to produce the determined one or more RF transmit modes that do not couple with the conductive object. Such an arrangement allows both the subject and the conductive object to be imaged, in a time divided manner.

Within the above the determined one or more non-coupling RF transmit modes may be produced at a higher power than the coupling RF transmit modes are produced. For example, they would typically be produced at the normal operating power of the scanner.

In addition, one embodiment further comprises repeatedly alternating: i) imaging the conductive object within the subject by controlling the parallel transmit MR scanner to produce the determined one or more coupling RF transmit modes at a reduced power than normal; and ii) imaging the subject by controlling the parallel transmit MR scanner to produce the determined one or more RF transmit modes that do not couple with the conductive object. In this way, images of both the conductive object and the subject can be repeatedly obtained. These may then be combined together into a single output image, for example by being at least partially overlaid one on to the other.

Moreover, in another embodiment there is repeatedly performed in order: i) determining the one or more RF transmit modes that couple with the conductive object located within the subject to be imaged; ii) imaging the conductive object within the subject by controlling the parallel transmit MR scanner to produce the determined one or more coupling RF transmit modes at a reduced power than normal; and iii) imaging the subject by controlling the parallel transmit MR scanner to produce the determined one or more RF transmit modes that do not couple with the conductive object. Again, images of both the conductive object and the subject can be repeatedly obtained which may combined together into a single output image, for example by being at least partially overlaid one on to the other. However, because the coupling modes are also determined for every imaging iteration, subject safety is increased, as it is always known which modes are the coupling modes before imaging is performed. In this respect, which modes are the coupling modes is not constant, and will change as the conductive object moves through the subject.

A further embodiment comprises determining the reduced power level for the coupling modes using an iterative power control process. More specifically, the iterative power control process may comprise: incrementing the transmit power of the coupling modes and attempting to image the conductive object, the incrementing repeating until the conductive object is successfully imaged. Such an incrementing process, which may increment the power of the coupling modes from a low level or from zero, ensures that only the minimum power necessary to image the conductive object is transmit in the coupling modes, thus further enhancing the safety of the subject.

In another embodiment, the parallel transmit MR scanner comprises N parallel transmit RF transmission elements, and the determining one or more RF transmit modes that couple with a conductive object located within a subject to be imaged comprises: (i) transmitting a plurality of RF pulses from the N parallel transmit RF transmission elements; (ii) determining the electric current induced in the conductive object by the plurality of RF pulses; and (iii) determining the one or more RF transmit modes that couple with the conductive object in dependence on the determined electric current. Preferably, each of the plurality of pulses is transmitted in sequence immediately after one another.

In some embodiments, the electric current induced in the conductive object is determined from an MR signal received at the N parallel transmit RF transmission elements. Preferably, an MR signal is measured after each of the plurality of RF pulses is transmitted. In doing this, no external sensor or other equipment is required to measure the RF transmit modes. Instead, the MR scanner itself can be used to determine the RF transmit modes.

Preferably, transmitting a plurality of RF pulses comprises transmitting N RF pulses from the N parallel transmit RF transmission elements.

The determining one or more RF transmit modes that couple with a conductive object and the imaging the conductive object may be performed simultaneously. That is, the RF transmit modes may be continuously monitored, whilst the conductive object is being imaged.

Additionally, one or more RF transmit modes that do not couple with the conductive object may also be determined in dependence on the determined electric current.

Another aspect of the invention also provides a parallel transmit MR scanner apparatus, comprising: i) a plurality of parallel transmit RF transmission elements; and ii) a controller, the controller being arranged to control the parallel transmit MR scanner apparatus such that in use the scanner: a) determines one or more RF transmit modes that couple with a conductive object located within a subject to be imaged; and b) images the conductive object within the subject by controlling the parallel transmit RF transmission elements to produce the determined one or more coupling RF transmit modes at a reduced power than normal.

In another aspect of the present invention, a method of measuring one or more RF transmit modes of a parallel transmit MR scanner comprising N parallel transmit RF transmission elements is provided, the method comprising: (i) transmitting a plurality of RF pulses from the N parallel transmit RF transmission elements; (ii) determining the electric current induced by the plurality of RF pulses in a conductive object located within a subject to be imaged based on an MR signal received at the N parallel transmit RF transmission elements; and (iii) determining one or more RF transmit modes that couple and/or do not couple with the conductive object in dependence on the determined.

A further aspect provides a parallel transmit MR scanner apparatus, comprising i) N parallel transmit RF transmission elements; and ii) a controller, the controller being arranged to control the parallel transmit MR scanner apparatus such that in use the scanner: (a) transmit a plurality of RF pulses from the N parallel transmit RF transmission elements; (b) determine the electric current induced by the plurality of RF pulses in a conductive object located within a subject to be imaged based on an MR signal received at the N parallel transmit RF transmission elements; and (c) determine one or more RF transmit modes that couple and/or do not couple with the conductive object in dependence on the determined electric current.

Further features of embodiments of the invention will be apparent from the appended claims.

BRIEF DESCRIPTION OF THE DRAWINGS

Embodiments of the invention will now be further described by way of example only and with reference to the accompanying drawings, wherein like reference numerals refer to like parts, and wherein:

FIG. 3 is a process diagram illustrating a process used in a first embodiment of the invention;

FIG. 4 is a process diagram illustrating the operation of a second embodiment of the invention;

FIG. 12 is a set of images showing the results of two different methods of current measurement used in the described embodiments;

EMBODIMENTS OF THE INVENTION

A brief overview of embodiments of the invention will now be given.

As noted previously, a vital aspect of iMRI is the ability to determine the physical location of the ID inside the patient. Embodiments of the present invention disclosed here allow an ID to be visualised in-vivo with the previously described hardware set up, calibration process and mathematical formalism of the prior art, but further controlled as described further below in a manner which induces no dangerous tissue heating.

More particularly, embodiments of the invention are based on the realisation that transmitting with a linear combination of the M 'coupling modes' (i.e. the RF transmit mode or modes that couple with the interventional device to cause heating thereof, and here referred to as the ID mode) has utility for visualizing the ID itself. The current induced on the ID by the ID mode or modes produces a secondary magnetic field whose strength is intense directly adjacent to the ID and quickly reduces in strength at further distances from the ID. When the ID mode is used by the Transmitter Control System at very low voltages levels, there is insufficient energy to produce tissue heating, yet there is sufficient magnetic field adjacent to the ID to generate signal from the spins to form a standard image. This image has the favourable property of having signal only adjacent to the ID, hence visualizing it.

Figure 2:
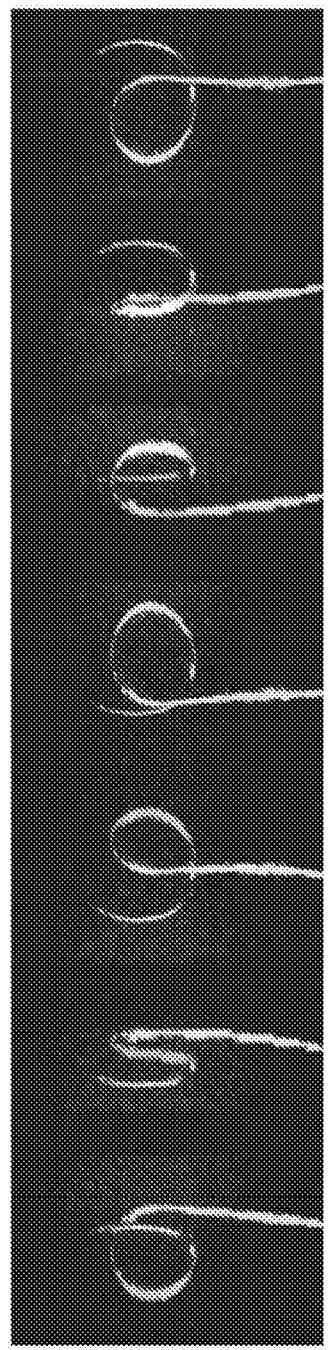
FIG. 2 is a series of images showing a guidewire imaged from different angles.

An example of the results obtained with this technique is shown in FIG. 2. A metallic (electrically conducting) guidewire was embedded in a meat phantom and monitored with a single current sensor while being scanned on a 3T Philips MRI system equipped with eight transmitters. The ID mode was obtained as previously described with respect to the Etezadi-Amoli prior art, and a 3D imaging sequence was performed using the ID mode at very low power, so as to prevent excessive heating of the conductive wire. Multiple projections through the imaged volume (as shown by the multiple images in FIG. 2, which are effectively images of the guidewire from multiple imaging planes around the wire) reveal the 3D location of the ID guidewire.

In more detail, an embodiment of the present invention allows an interventional device to be visualised in-vivo in a manner which induces no potentially dangerous tissue heating. For present purposes, 'interventional device' refers specifically to the subclass of device which is long, thin and conductive, such as guidewires.

Figure 1:
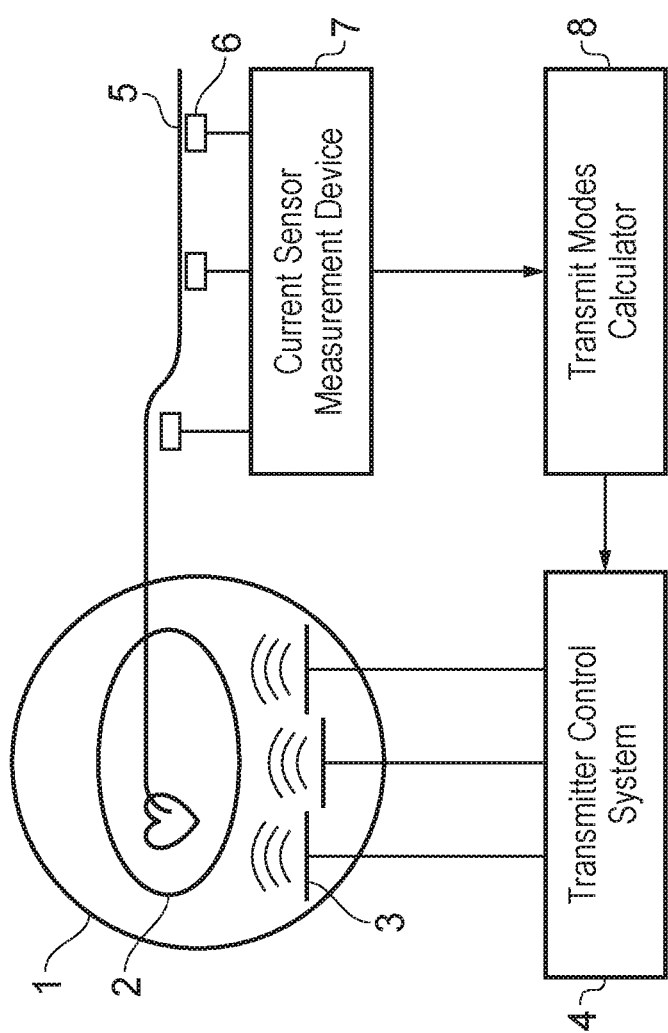
FIG. 1 is a system block diagram which forms the basis for embodiments of the invention.

As shown in FIG. 1, the patient 2 is located in a whole body MRI system equipped with N radiofrequency transmit antennas 3. The interventional device 5, which does not need to be modified, is partially inserted into the patient 2. The portion of the device external to the patient is monitored by M dedicated sensors 6. The sensors are placed at several different positions on the external part of the device. They measure the amplitude and phase of any radiofrequency currents induced on the interventional device by the transmit field.

Figure 9:
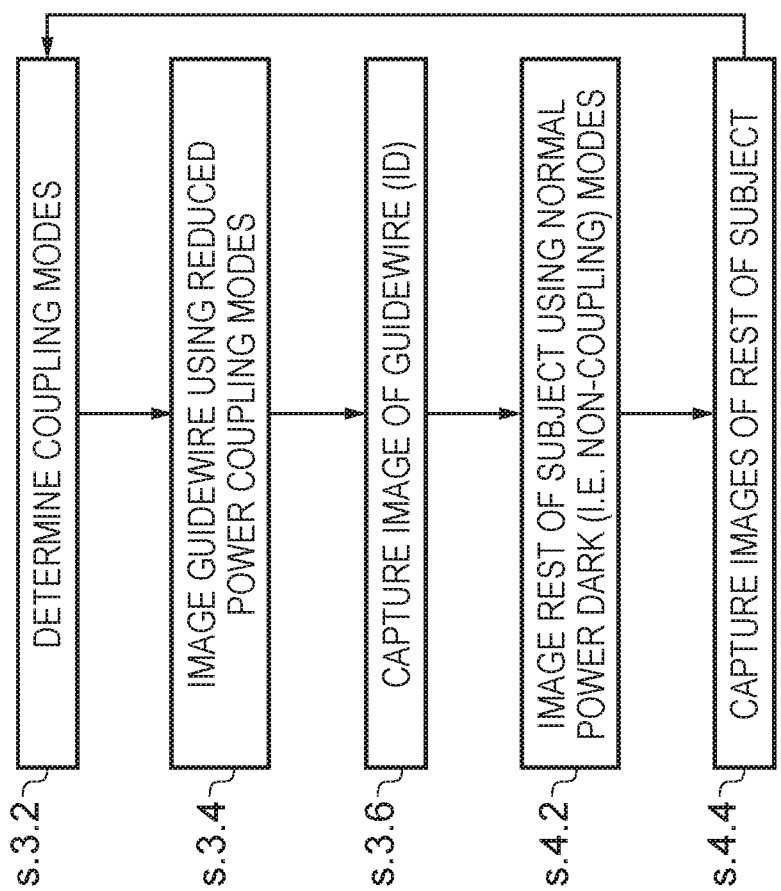
FIG. 9 is a process diagram illustrating the operation of a third embodiment of the invention.

With the above apparatus set-up, in embodiments of the invention the processes of FIG. 3, 4, or 9 are followed. More particularly, with respect to a first embodiment of FIG. 3, the following calibration process is performed at regular intervals, as s.3.2. A single transmitter 3 is driven by a low amplitude RF pulse; concurrently with this, the current sensors 6 measure the induced current by that transmitter. This is repeated for each transmitter 3, resulting in data showing how much current is induced by each transmitter at each current sensor. This data is then processed in the manner taught by Etezadi-Amoli, ibid, resulting in (N-M) 'modes' of driving the transmitters which induce no currents on the device, and M 'modes' in which currents are induced. Each 'mode' is given by an amplitude and a phase setting for each transmitter. As such, the coupling modes which couple to the interventional device, and the "dark modes" which do not, can thus be determined.

Next, at s.3.4, the coupling modes are used to enable visualisation of the interventional device. More particularly we control the MRI transmit coils to transmit at the particular amplitudes, frequencies, and phases so as to generate the M 'coupling modes' in the subject (or at least a subset of one or more of the M coupling modes). The generated modes in turn induce currents on the interventional device, which is conductive. Transmitting in a coupling mode induces currents which in turn create a further secondary transmit field of very large amplitude adjacent to the device. This will create signal via the standard MRI process, even when the coupling mode is driven at very low amplitude, for example at 10% of the normal drive signal level. The MRI signal will be bright adjacent to the device, enabling it to be localised and an image to be generated therefrom at s.3.6. Moreover, because of the low amplitude pulses (e.g. 10% of normal power), no heating will be induced and little signal will be generated except close to the wire.

Therefore, within the embodiment of FIG. 3, two main steps are performed, being: 1) the identification of coupling modes (which is performed using the techniques taught by Etezadi-Amoli); and then 2) imaging the subject with a linear combination of these coupling modes at sufficiently low power to obtain an image only of the ID, but without causing substantial heating of the ID. As described previously with respect to FIG. 2, and in more detail in the results section below, such a technique of using low power RF coupling of the identified coupling modes to induce small currents in the conductive ID, which in turn generate localised magnetic fields around the ID that facilitate MR imaging thereof, allows for clear and accurate imaging of the position of the ID within the subject. Such a technique is of much use during surgical procedures making use of iMRI, but without the danger of the conductive ID excessively heating and causing damage to the surrounding tissue.

A further embodiment is shown in FIG. 4. Here, the coupling modes are determined at s.3.2 in the same manner as described in respect of the above embodiment, using the techniques of Etezadi-Amoli. Moreover, the imaging of the ID or guidewire is also performed in an identical manner to the above described embodiment. However, in this embodiment, as well as imaging the guidewire or ID using the coupling modes, the MR scanner is further automatically controlled to then switch, at s.4.2, to producing non-coupling (so-called "dark" modes) at normal power levels, to allow for MR imaging of the rest of the subject, at s.4.4. This switching of the MR parallel transmit coils from producing coupling modes that couple to the ID at low power (e.g. around 10% of normal) to producing non-coupling dark modes that do not couple to the ID, but at full normal power to allow normal imaging allows for time interleaved imaging of both the ID or guidewire, and the surrounding soft tissue of the subject in a safe manner. Effectively, both the guidewire and the soft tissue can be imaged on a time divided basis, such that the MR parallel transmit coils alternate between producing dark modes that do not couple with the ID, but which are at full (or otherwise normal) power, and the coupling modes which do couple at reduced power. If the frequency of switching between the dark imaging modes and the coupling modes is fast enough (dependent on the image rendering speed of the MR scanner), an almost real time simultaneous image of both the ID and the soft tissue may be produced. Alternatively, a simultaneous image of the both the ID and the soft tissue can be artificially produced and displayed to the user by combining images of the same volume in the subject obtained from both the dark modes and the coupling modes together, for example by overlaying one image on top of the other, and displaying the resultant image to the user on a display.

Within the embodiment of FIG. 4, therefore, the parallel transmit coils of the MR scanner can be controlled to alternately produce low power coupling RF modes which allow the conductive ID or guidewire to be imaged, and then dark, non-coupling, RF modes, but at a higher power than the coupling RF modes, which are used to image the soft tissue of the subject.

A further embodiment is shown in FIG. 9. This embodiment is based upon the second embodiment described above, and includes all of the same steps therein, which will not be described again. However, where this embodiment differs from the second embodiment is that the calibration process of s.3.2 is repeated in real-time, in addition to the real-time interleaved guidewire/anatomical imaging described above with respect to the second embodiment. This operation enables the identification of the coupling modes to be updated in real-time, which is important, as the coupling changes as the guidewire or ID moves through the electromagnetic field.

With the above, therefore, three processes are interleaved together, and then performed in order. Firstly, the coupling modes are determined, as at s.3.2 described previously. Then, the guidewire or other interventional device is imaged using the reduced power coupling modes, at s.3.4 and 3.6, and thereafter the rest of the subject is imaged using the normal power non-coupling modes, as at s.4.2 and 4.4. Thereafter the process returns to 3.2. again, and the coupling modes are determined once again, before further imaging of the guidewire or ID is undertaken. As noted above, this is because the coupling modes that couple to the guidewire or ID change, as the ID or guidewire moves through the subject, and hence it is necessary to update which modes are the coupling modes so that there is no inadvertent transmission of coupling modes at a power level that would cause heating of the conductive ID or guidewire as the guidewire or ID moves through the subject.

Figure 10:
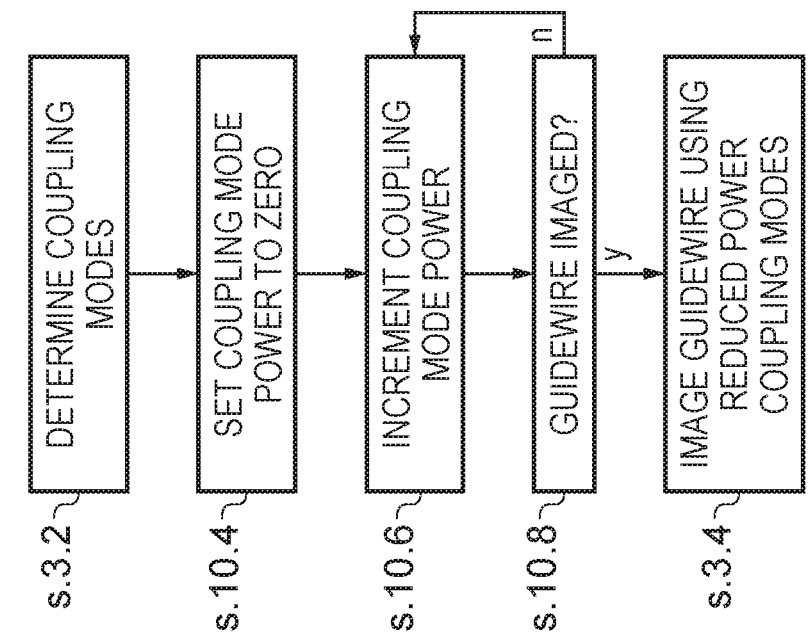
FIG. 10 is a process diagram illustrating a process used in a fourth embodiment of the present invention.

FIG. 10 illustrates a further process that may be used with all of the above described embodiments to determine the transmission power of the coupling modes. Above we describe that the transmission power may be set to a fraction of the "normal" imaging transmit power, that fraction being such that no undue heating is caused in the guidewire. For example, a level of 10% should be sufficient. However, performance and safety is improved if this transmit power is dynamically determined so that it can be set to the minimum power level that is sufficient to image the guidewire. FIG. 10 illustrates a process that may be performed between the steps 3.2 and 3.4 of the previously described embodiments, in order to allow the minimum coupling mode power to be iteratively determined, by increasing the transmission power of the coupling modes incrementally from zero, until the guidewire has been imaged, at which point that transmission power is then used for imaging of the guidewire.

In more detail with reference to FIG. 10, once the coupling modes have been determined by s.3.2, at s.10.4 the coupling mode transmission power is set to zero. That is, more precisely, the phases and amplitudes of the different drive signals fed to the parallel transmit coils are adapted such that the resulting power of the determined coupling modes is zero. Then, from this zero power coupling mode state, the coupling mode power is incremented is small increments, for example a few mW at a time, at s.10.6, and an attempt to image the guidewire is performed for each power increment, at s.10.8. This incremental process iterates until a coupling mode power is reached at which an image of the guidewire is obtained, at which point that power setting is then used to image the guidewire at s.3.4. Of course, by "power setting", we mean the particularly combination of drive signal phases and amplitudes fed to the PT coils that produce the coupling mode of the determined power, as would be understood by the intended reader.

With such a dynamic power setting process, only the minimum power necessary in the coupling modes to image the guidewire or ID is used, and hence heating of the guidewire or other ID should be minimised, and safety for the subject improved. The dynamic power setting process of FIG. 10 may be used in any of the above described embodiments of FIG. 3, 4, or 8.

EXPERIMENTS AND RESULTS

As discussed in the above described embodiments, consider an N element PTx system with M current sensors placed on the exposed sections of a partially-inserted guidewire. The coupling ($c_{m,n}$) of the $n^{th}$ transmitter to $m^{th}$ current sensor is found by measuring the induced currents whilst transmitting on each element sequentially. Performing an SVD on the M×N coupling matrix C generates N RF shims of unit-norm. The (N-M) shims with zero-valued singular values (referred to as dark modes, DMs) produce no wire current and can therefore be harnessed for safe imaging. The M remaining shims (referred to as coupling modes, CMs) produce wire currents and are typically discarded. It has been noted that wire currents produce a magnetic field whose magnitude is inversely proportional to the radial distance from the wire. Consequently, even small wire currents can produce significant B1+ adjacent to it. As explained above, we propose the use of this mechanism to enable guidewire visualisation.

Proof of principle experiments were performed on a 3T Philips Achieva with an 8-channel TEM body coil (5) and 6-channel torso rx-array. A guidewire (Terumo, Japan) was inserted into a meat phantom via embedded tubing filled with doped saline (0.7 g/L NaCl, 0.02% Dotarem), shaped to mimic a 3D interventional guidewire trajectory. Currents on the exposed section of the guidewire (oriented parallel to B0) were monitored by two current sensors, whose signals were measured by the scanner spectrometer and power meters (Rohde & Schwarz NRP-Z11). The matrix C was determined using spectrometer measurements and six DMs were then calculated. B1+ maps of the modes were obtained using volumetric AFI (6,7) (transmitting in quadrature, FOV=370×92×120 mm, res=$3^3$ mm, FA=40°, BW=723 Hz, TR1=25 ms, TR2=125 ms, TE=4.6 ms) in conjunction with low flip angle SPGRs (8) of each mode (as AFI, except TR=10 ms and FA=1°). Four sets of shims were used for imaging: a quadrature shim, shims comprised of the sum of the six DMs, the first CM, and the first CM reduced to 10% amplitude. Guidewire visualisation was tested using a multi-shot TSE (FOV=300×150×51, res=0.75×1, dz=3 mm, FA=90°, TSE factor=13, TR=4422 ms, TE=52 ms) with concurrent power monitoring.

Results

Figure 5:
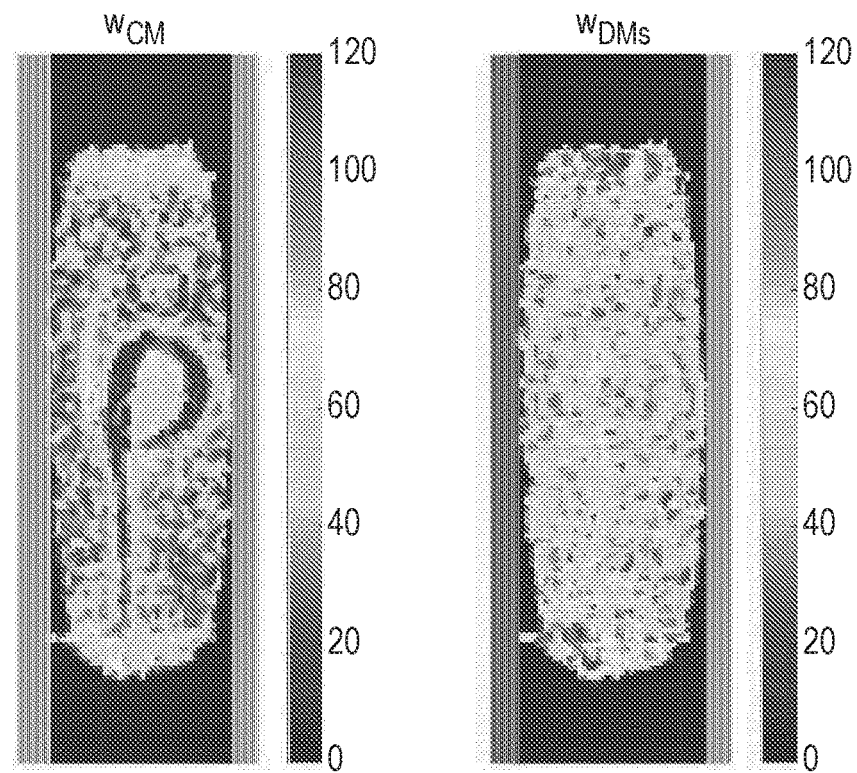
FIG. 5 is a set of images showing results of the operation of the described embodiments.
Figure 8:
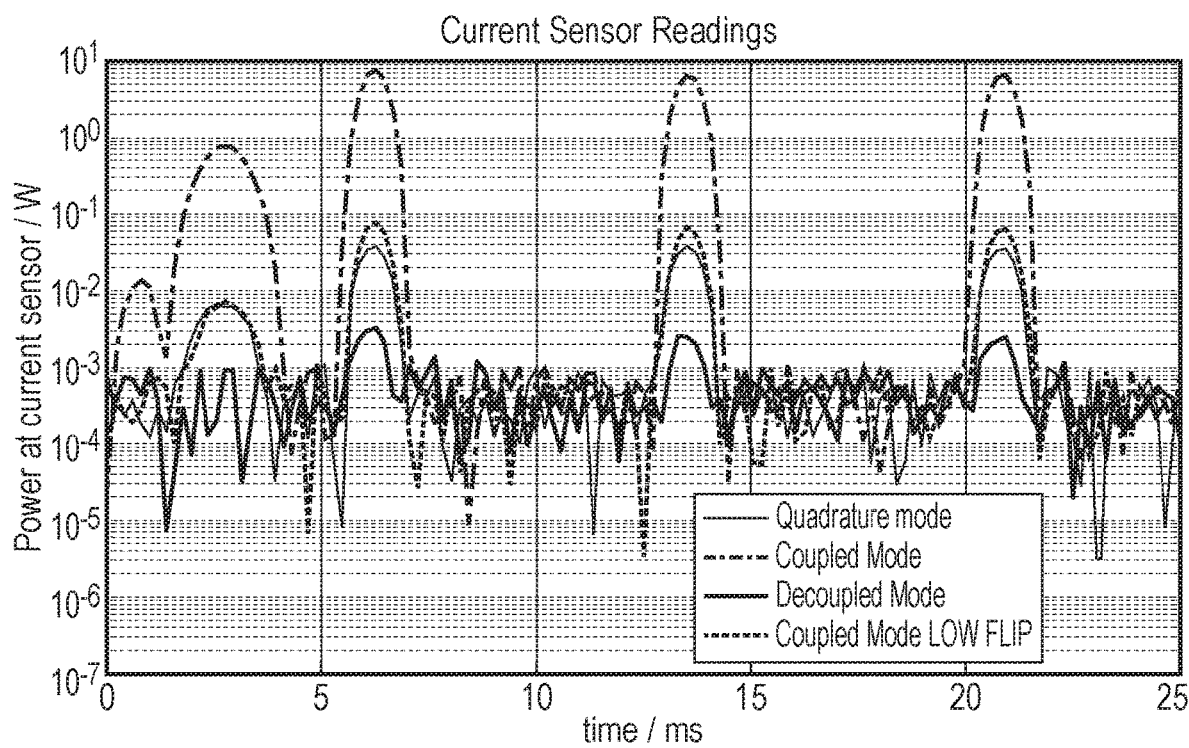
FIG. 8 is a chart relating to results of the operation of the described embodiments.
Figure 6:
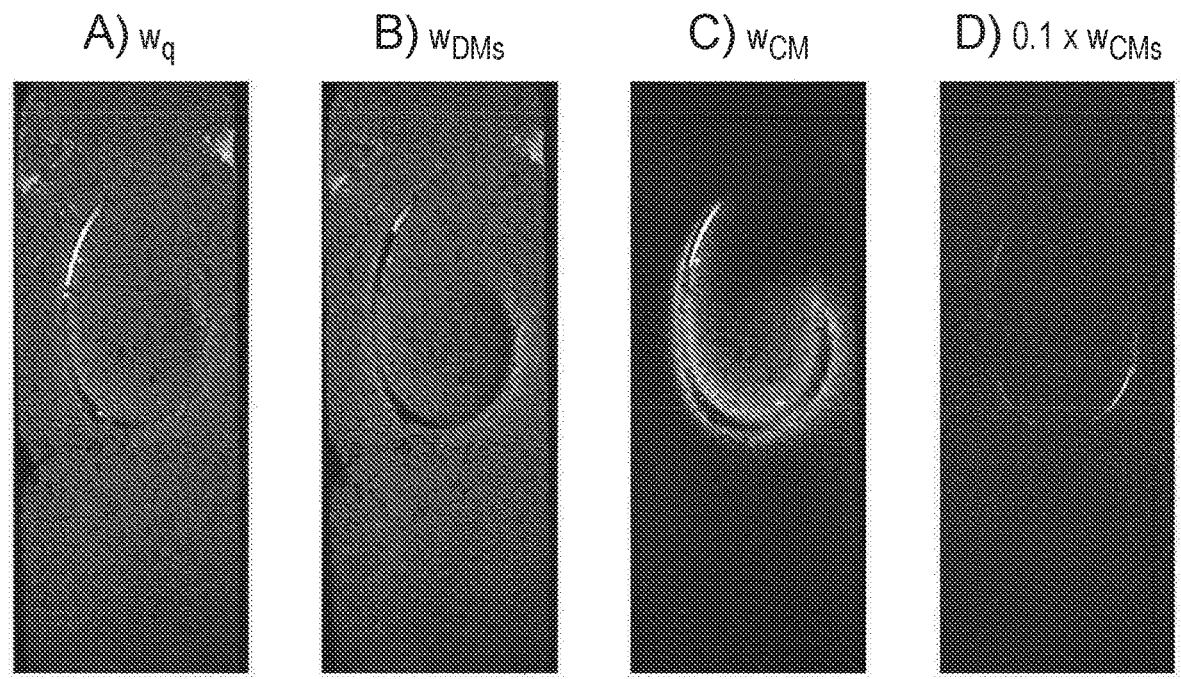
FIGS. 6 and 7 are both a series of MR images illustrating the results of the operation of the described embodiments.
Figure 7:
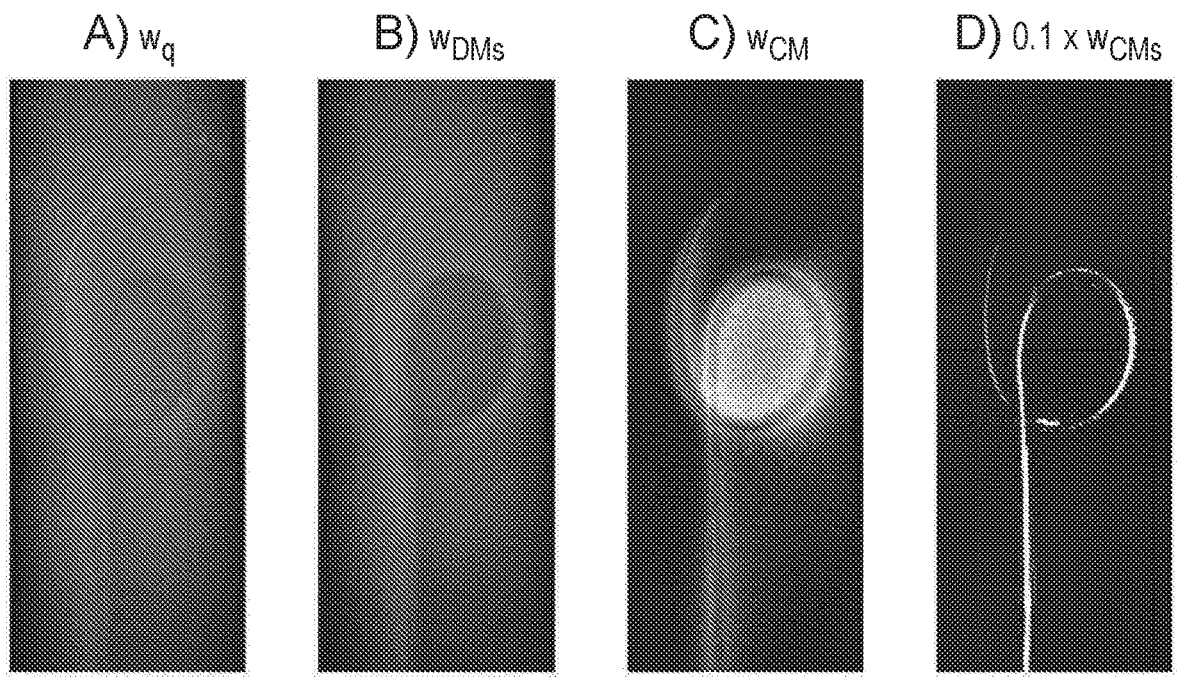

FIG. 5 shows maximum intensity projections (MIPS) of B1+ maps of the CM and DM shims. The CM map exhibits large B1+ due to currents on the wire; this is not apparent for the DM map. FIG. 6 shows example coronal TSE images. The guidewire is partially visible with quadrature shim (FIG. 6A) due to uncontrolled coupling to both transmit and receive fields. FIG. 6B shows an inherently safe imaging mode; the GW imparts an intensity modulation purely due to receive interaction. FIG. 6C shows imaging with CM; signal is generated around the wire, but its large amplitude can cause heating and the resulting signals from the wire are too diffuse to facilitate visualisation. FIG. 6D shows the image acquired with reduced amplitude CM—signal is restricted to immediately adjacent to the guidewire. FIG. 7(A to D) shows MIPs through the TSE volumes—accurate depiction of the guidewire location is only possible when using the reduced amplitude CM. FIG. 8 shows current sensor power readings for the first 25 ms period of the TSE shot. CM produces the highest readings of 8 W; reducing their amplitude to 10% reduces the power by a factor of 100 to the power level produced by quadrature.

Discussion of Results

Successful guidewire visualisation has been demonstrated using the CM of a PTx array. All images exhibit receive enhancement due to the presence of a guidewire, however this is not sufficiently restrictive to allow visualisation. Operating with CM at low drive is vital for both safety and useful for visualisation. The proposed method is analogous to the reverse polarisation method (9), except with the RF field optimally designed to couple to the wire.

Alternative Method for Obtaining Coupling Modes

Figure 17:
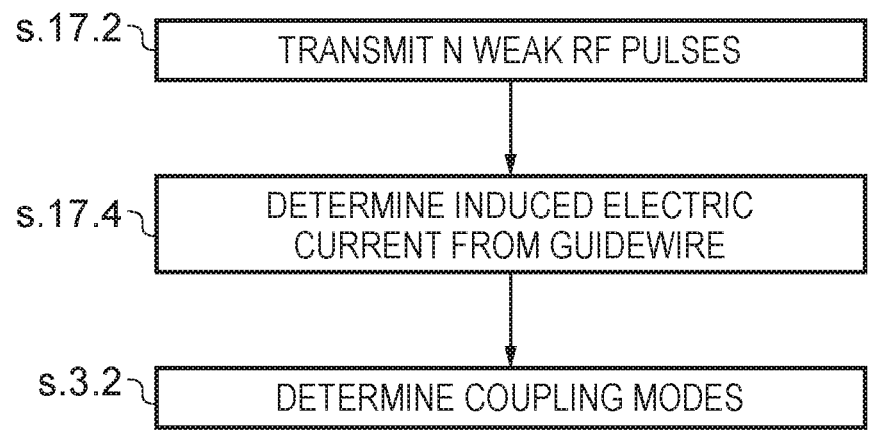
FIG. 17 is a process diagram illustrating a pre-calibration process used in the described embodiments.

An alternative method for measuring the relative coupling between elements of a parallel transmit (PTx) array 3 and conductive structures 5 such as guidewires or braided catheters, as illustrated by FIG. 17, will now be described.

Introduction

As described previously, MRI guidance of interventional procedures using guidewires or catheters is limited by potential heating of tissue caused by radio frequency (RF) coupling with the MRI transmit coil (11, 13, 14). In a PTx system, decoupling modes (DM) exist that can reduce RF coupling risks and a procedure for finding them using current sensors on the wire has been demonstrated (2) by the Etezadi-Amoli prior art. As shown by Etezadi-Amoli, it is possible to determine the operating modes s.3.2 in which the RF induced currents can be nulled or maximised (2) by performing matrix decomposition on a coupling matrix. Whilst external sensors 6 such as those shown in FIG. 1 can provide a reliable means for measuring the induced currents, they can interrupt the workflow of the interventional procedure by interfering with the placement of devices.

Instead, a method to achieve the same without the need for extra sensors may be used that utilises a direct MRI based measurement to yield similar information to an external sensor for the purpose of device decoupling using a PTx array. The MR based method uses a very short series of very low flip angle (vLFA) RF pulses that can be implemented as the pre-calibration for imaging sequences. The method relies on strong local enhancement of B1 fields close to conductors due to induced currents. Data acquired from single pulse-acquire measurements using very low flip angles is hence dominated by these induced current contributions. Coupling matrices for N-channel arrays can therefore be estimated using only N pulses, and it is has been demonstrated that these are similar to those obtained from dedicated current sensors.

The spatial distribution of fields produced by induced currents on devices have previously been mapped using MRI methods and model fitting has been used to infer currents from these measurements (10, 11), but these prior approaches required detailed high resolution imaging, which is slow (so problematic to integrate into a real time workflow) and requires many RF pulses (so may in some scenarios not be safe to apply without prior safety checks such as using physical sensors). Specifically, these other methods first need to use MR imaging to produce a whole image, and then use some knowledge of how induced currents distort the image process to reverse engineer the actual induced current, which is a slow and arduous process.

In contrast, the pulse based method described herein works using only a single RF pulse for each transmit coil and the subsequent data acquisition. This process takes milliseconds to perform and can therefore be used to monitor the coupling in real-time during acquisition of a different set of images. Since the prior art methods require images to be acquired first, they are not easily integrated into a sequence that is itself trying to make an image of something else.

Theory

When a linear conductive device 5 is in the presence of a fluctuating electromagnetic field, as produced by the PTx array 3, currents in the device 5 are induced that in turn produce their own magnetic field. This induced magnetic field changes the MRI transmit B1 field locally and hence the measurable nuclear magnetic resonance (NMR) signal.

That is, the presence of the linear conductor device 5 leads to local enhancement of the RF magnetic field ($B_1+$) for any driven transmit element, $B^+_{1,coil}$, such that:

$$B^+_1 = \frac{\alpha}{r} + B^+_{1,coil} \quad [3]$$

where r is radial distance from the conductor 5, and the complex quantity $\alpha$ is proportional to the induced current, which has previously been measured using current sensors or full B1 mapping (2). For a transmit array, each element produces a different $\alpha$, which can be used to estimate the DM.

As such, the induced B1 field is local to the conductive device 5, falling away with the inverse of the distance from it. Hence, when a weak B1 field is applied from the RF transmitter 3, the overall B1 field is only strong enough to produce measurable MR signal very close to the device 5. As a result, the relative amplitude and phase of this measured signal is directly proportional to the amplitude and phase of the current induced in the device 5 (integrated through the volume).

LFA gradient echo scans have the property that the signal is linear in the applied flip angle, and hence $B_1+$. Since the B1+ field drops off quickly with r, signals acquired at vLFA are dominated by contributions very close to the conductor. This is further reinforced by local receive sensitivity enhancement due to the reciprocal effect of the conductor on the receiving coil (whether the same as the transmitter or otherwise). Hence, a single non-spatially encoded measurement after a vLFA RF pulse will primarily relate to the RF coupling $\alpha$. Hence, with an N channel array coil, the application of N such pulse/measure cycles (one per channel) can be used to measure the RF coupling of each element in turn.

Therefore, by measuring signals from weak RF pulses applied to each transmit channel in turn, it is possible to measure a coupling matrix which is directly analogous to the coupling matrix of the Etezadi-Amoli technique that would be measured using a physical current sensor 6, as described above.

As such, for N-channel arrays, N pulses are first transmitted (s.17.2), that is, a pulse for each transmission element. The current induced by each of these N pulses can then be determined (s.17.4) by deriving the current from the MR signal received at each transmission element. The determined currents are used to calculate a coupling matrix and determine the coupling (and decoupling) modes therefrom (s.3.2). As the coupling and/or decoupling modes are determined using the parallel transmit (PTx) array 3 itself, the coupling can be monitored whilst images of the conductive wire 5 are being captured. The pulses are transmitted in sequence, however, each pulse may be transmitted almost immediately after one another. As such, the whole set of pulses can be transmitted within a few milliseconds. In approaches that require current sensors such as the Etezadi Amoli approach, the induced current is measured during the pulse transmission itself. When using the scanner itself, the MR signal is measured immediately after each pulse, and the induced current determined therefrom. For example, a pulse may be transmitted for 0.1 ms, the MR signal acquired for 0.1 ms, and then repeated for the N required measurements.

The use of MR based measurements for measurement of the coupling matrix relies on two important observations:
1. The observed MR signal is dominated by contributions from material very close to the conductive device, when very weak RF pulses are applied.
2. The signal is linearly proportional to the induced current amplitude (and phase) as long as the induced fields are not too strong.

A challenge is to select an input power level that is large enough to produce a measurable signal, while still being in the regime that the signal is (a) dominated by the device and (b) linearly proportional to the coupling. It may be that a brief set of calibration methods can be used to determine this power level by testing for linearity in the measured signal (12).

Initial experiments have proven that the proposed measurement scheme produces coupling matrices that are similar to those measured from physical sensors, and heating tests conducted using the decoupling modes identified from these coupling matrices produce minimal device heating.

A potential additional advantage of the pulse based method is that it directly measures a quantity within the subject that is proportional to the current on the device, and thus it is possible that it may be able to detect current distributions that would not be discernible using external current sensors.

With such a pulse-based coupling measurement (PCM) method, operating modes can be determined with no physical modifications to or impediments on catheterization tools and devices. Existing methods either require wires/catheters that are specifically designed for MRI, and which remain sub-optimal, or require the presence of passive sensor(s) over standard devices, which have the disadvantage of interrupting manipulation of said devices, and also posing a potential problem for sterilisation. The pulse-based method also requires no additional hardware (such as digital RF receivers) that would be required to record signals from external sensors. Instead, the MRI scanner itself can be used directly.

Methods

All measurements were performed on a 3T Philips Achieva with an 8-channel TEM transmit-receive body coil (5) using a phantom fabricated from a half pipe filled with poly acrylic acid gel (15) with inserted nitinol guidewire (Terumo Corporation, Japan) instrumented by an optically coupled toroidal current sensor (16) placed over its proximal end outside the scanner bore that was connected to the scanner's spectrometer (Phillips) for digitization. The coupling measurement method was implemented using a normal 3D spoiled gradient echo sequence. Sixteen nominal flip angles (FA) ranging from $\frac{1}{20}°$ to 20° (TR=10 ms, TE=1.25 ms) were tested, both reconstructing images and simply using the central k-space data point for the non-spatially encoded measures. In each acquisition, a single coil element was used to transmit with all coils used to receive.

Coupling/decoupled modes were computed on coupling measurement data (i) from the current sensor and (ii) the proposed method using SVD as in the Etezadi-Amoli approach; B1 field maps using volumetric Actual Flip angle Imaging (AFI) (7) were acquired using each of the identified modes in turn in order to assess the resulting field patterns (FOV=400×160×80 mm, Voxel=5×5×5 mm, FA=80°, TR=25/125 ms, TE=1.82 ms). The temperature at the end of the wire was monitored using a fibre-optic temperature probe (LumaSense Technologies, Inc. USA).

Results

Figure 11:
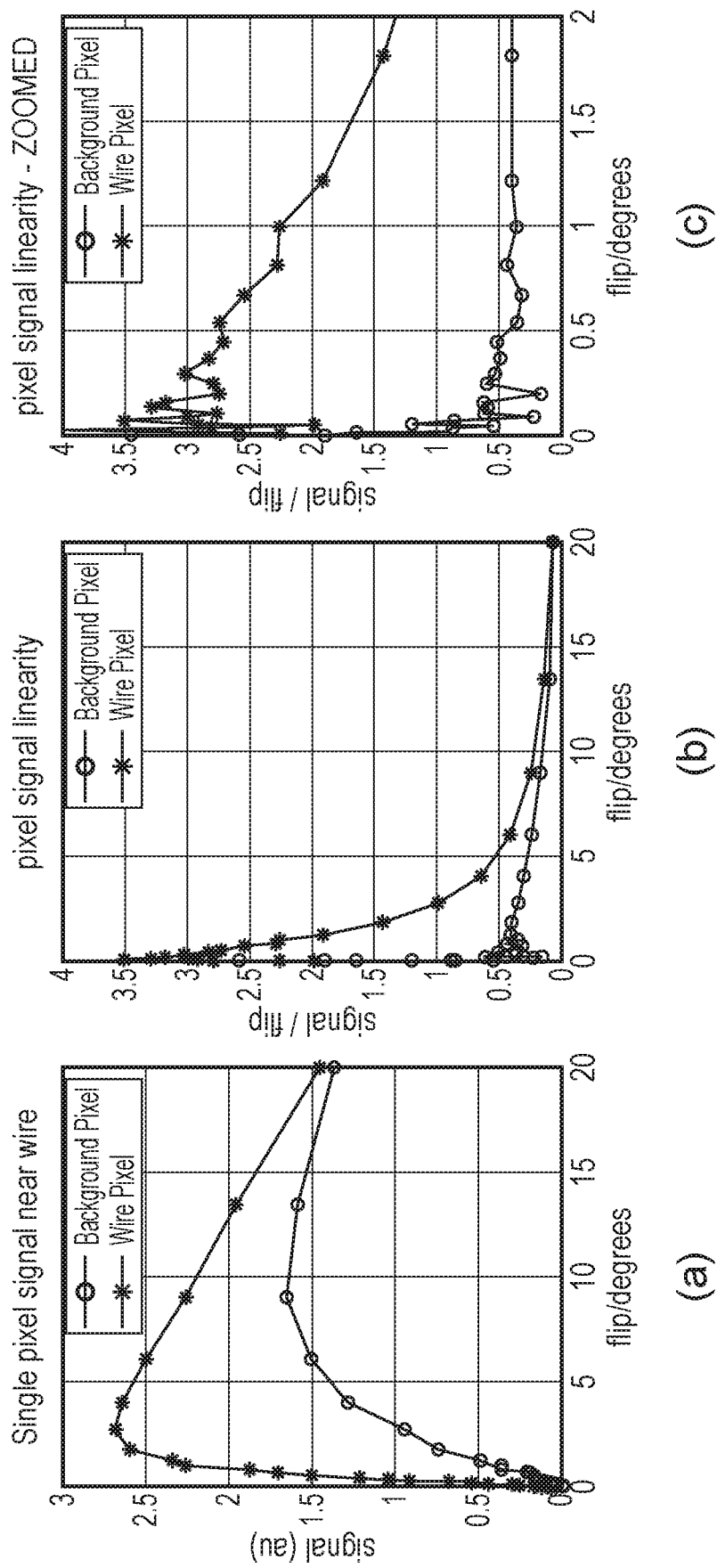
FIG. 11 is a set of charts relating to the results of a process used in the described embodiments.

FIGS. 11(a)-(c) show the signal from pixels close to and far from the wire, determined by full imaging. FIG. 11(a) shows a single pixel signal near the wire versus a pixel in the background. The background signal is mainly from the B1 field without enhancements. The signal is plotted for 16 prescribed flip angle from $\frac{1}{20}°$ to 20°. Based on this, data for flip=0.1° was used to derive coupling measurements, as this was judged to be within the linear regime. For both current sensor and the proposed method, a single coupled mode and seven decoupled modes were identified, as shown by Figure. Row (a) of FIG. 12 shows a polar plot of the complex coupling values of the coupling matrix obtained using the LFA method, along with corresponding image plots of the coupling modes magnitudes and relative phases. Row (b) of FIG. 12 shows a polar plot of the complex coupling values of the coupling matrix obtained using external sensors, along with corresponding image plots of the coupling modes magnitudes and relative phases.

Figure 13:
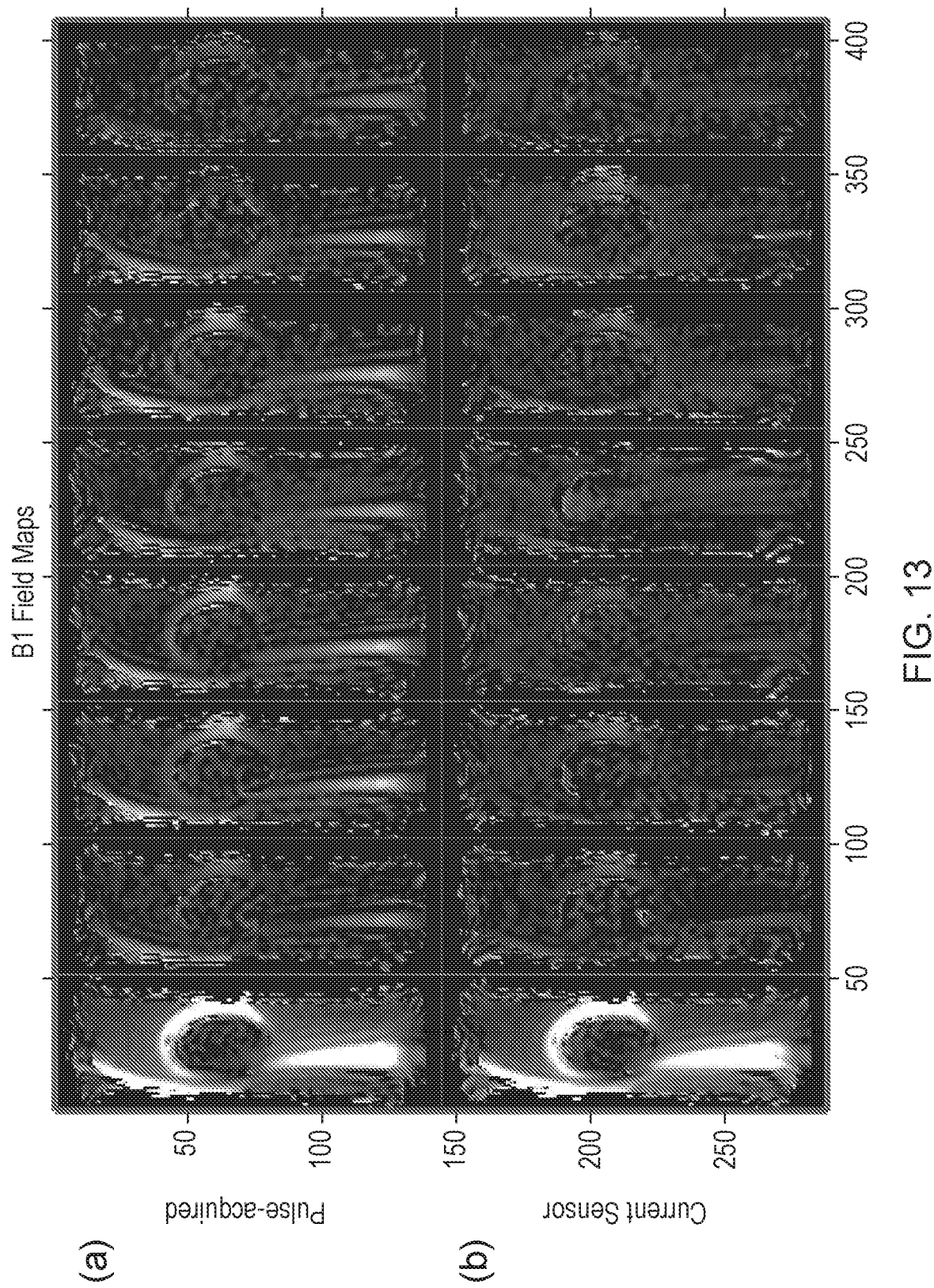
FIG. 13 is a set of images showing the results of two different methods of current measurement used in the described embodiments.

Single slice B1 field maps corresponding to each of the modes in both cases are shown in FIG. 13. Specifically, FIG. 13 shows a slice image of B1 AFI transmit maps for each coupling mode derived with the LFA sequence (a), and the B1 AFI maps for each coupling mode derived with the current sensor (b). Patch 1 is the coupled mode and patches 2-7 are the decoupled modes, likewise, Path 9 is the coupled mode and patches 10-16 are the decoupled modes.

Figure 14:
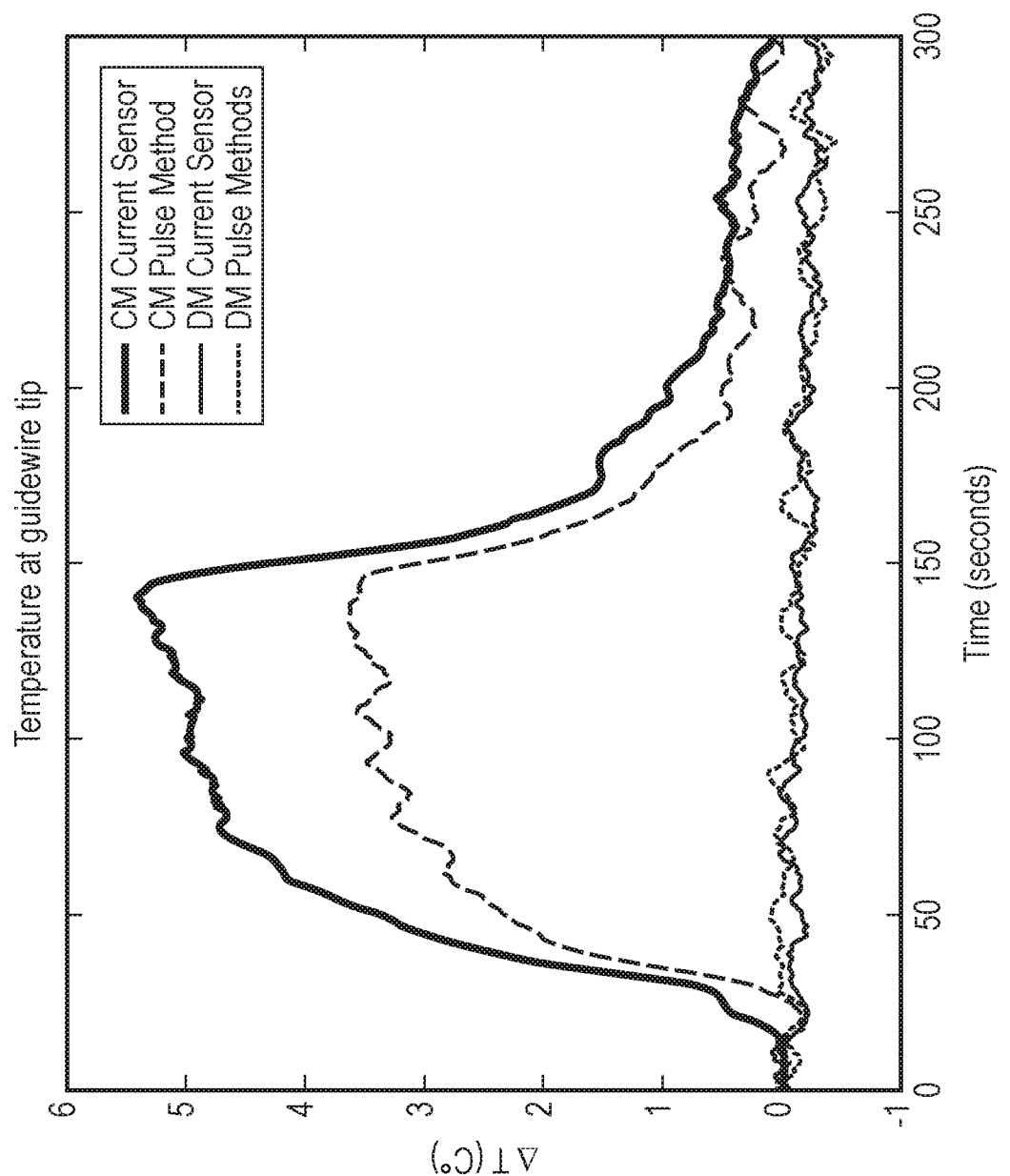
FIG. 14 is a chart relating to the results of two different methods of current measurement used in the described embodiments.
Figure 15:
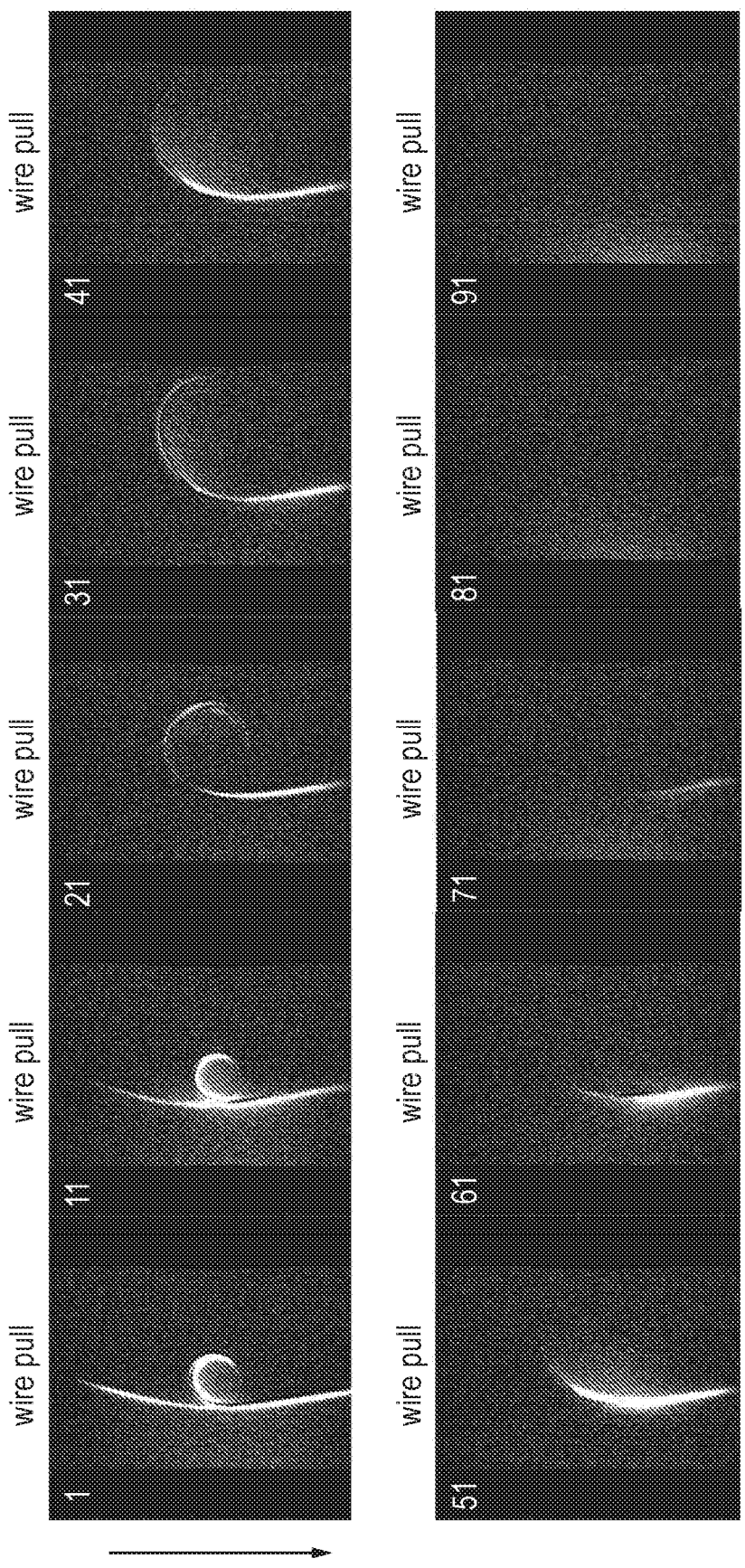
FIG. 15 is a series of images showing results of the operation of the described embodiments, wherein a guidewire is being pulled in a first direction.
Figure 16:
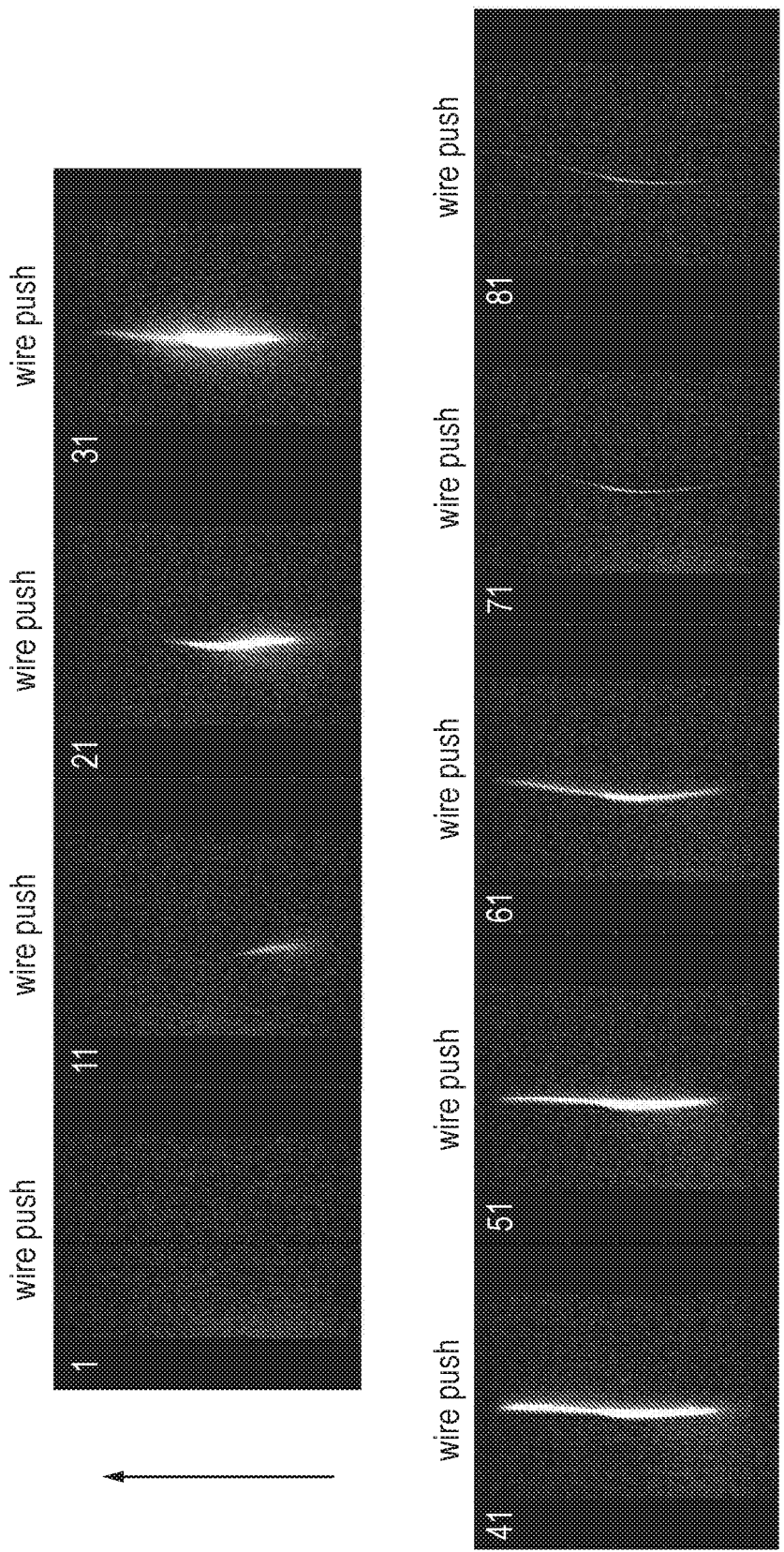
FIG. 16 is a series of images showing results of the operation of the described embodiments, wherein a guidewire is being pushed in a direction opposite to that shown in FIG. 15.

FIG. 14 shows temperature measurements obtained during imaging for coupling/decoupling modes derived using both the LFA method and external sensors.

Discussion

The proposed LFA method identifies coupling modes that are similar but not exactly the same (FIG. 12) to those from a current sensor. This can be seen in B1 maps (FIG. 13) where the proposed method leads to some residual B1 field from the wire when using 'decoupled' modes, and in the temperature measurements where the coupled mode results in a lesser degree of heating (FIG. 14). A key difference is that the proposed method is based on an average through the sample rather than single point measurements made by a sensor. This could potentially be changed by use of slice selective RF pulses. Since the method uses single pulse measurements it has the potential to be very fast, which may allow pseudo-real time measurement. It is hypothesised that a coupling strong enough to pose a risk of heating is where the wire mediated signal is in the linear regime and the ratio of wire signal to background is large enough to neglect the latter.

REFERENCES

1. Konings M K, Bartels L W, Smits H F M, Bakker C J G. Heating Around Intravascular Guidewires by Resonating RF Waves. J. Magn. Reson. Imaging 2000; 12:79-85. doi: 10.1002/1522-2586(200007)12:1<79::AID-JMRI9>3.0.CO; 2-T.

2. Etezadi-Amoli M, Stang P, Kerr A, Pauly J, Scott G. Controlling radiofrequency-induced currents in guidewires using parallel transmit. Magn. Reson. Med. 2014:n/a-n/a. doi: 10.1002/mrm.25543.

3. Gudino N, Sonmez M, Yao Z, et al. Parallel transmit excitation at 1.5 T based on the minimization of a driving function for device heating. Med. Phys. 2015; 42:359-371. doi: 10.1118/1.4903894.

4. McElcheran C E, Yang B, Anderson K J T, Golenstani-Rad L, Graham S J. Investigation of Parallel Radiofrequency Transmission for the Reduction of Heating in Long Conductive Leads in 3 Tesla Magnetic Resonance Imaging. PLoS ONE 2015; 10:e0134379. doi: 10.1371/journal.pone.0134379.

5. Vernickel P, Röschmann P, Findeklee C, Lüdeke K-m, Leussler C, Overweg J, Katscher U, Grässlin I, Schünemann K. Eight-channel transmit/receive body MRI coil at 3T. Magn. Reson. Med. 2007; 58:381-389. doi: 10.1002/mrm.21294.

6. Yarnykh V L. Actual flip-angle imaging in the pulsed steady state: A method for rapid three-dimensional mapping of the transmitted radiofrequency field. Magn. Reson. Med. 2007; 57:192-200. doi: 10.1002/mrm.21120.

7. Nehrke K. On the steady-state properties of actual flip angle imaging (AFI). Magn. Reson. Med. 2009; 61:84-92. doi: 10.1002/mrm.21592.

8. Van de Moortele P F, Snyder C, DelaBarre L, Adriany G, Vaughan J, Ugurbil K. Calibration tools for RF shim at very high field with multiple element RF coils: from ultra fast local relative phase to absolute magnitude B1+ mapping. In: Proceedings of the Joint Annual Meeting ISMRM-ESMRMB. Berlin, Germany; 2007. p. 1676.

9. Overall W R, Pauly J M, Stang P P, Scott G C. Ensuring safety of implanted devices under MRI using reversed RF polarization. Magn. Reson. Med. 2010; 64:823-833. doi: 10.1002/mrm.22468.

10. van den Bosch, M. R., Moerland, M. A., Lagendijk, J. J. W., Bartels, L. W., van den Berg, C. a T., & den Berg, C. A. T. (2010). New method to monitor RF safety in MRI-guided interventions based on RF induced image artefacts. Medical Physics, 37(2010), 814-821. http://doi.org/10.1118/1.3298006

11. Griffin, G. H., Anderson, K. J. T., Celik, H., & Wright, G. A. (2015). Safely assessing radiofrequency heating potential of conductive devices using image-based current measurements. Magnetic Resonance in Medicine, 73(1), 427-441. http://doi.org/10.1002/mrm.25103

12. Padormo F, Hess A T, Aljabar P, Malik S J, Jezzard P, Robson M D, Hajnal J V & Koopmans P J. Large Dynamic Range Relative $B_1^+$ Mapping. Magn. Reson. Med. 2016; 76:490-499 doi:10.1002/mrm.25884

13. Nitz W R, Oppelt A, Renz W, Manke C, Lenhart M, Link J. On the heating of linear conductive structures as guide wires and catheters in interventional MRI. *J Magn Reson Imaging.* 2001; 13(1):105-114. doi:10.1002/1522-2586(200101)13:1<105::AID-JMRI1016>3.0.CO; 2-0.

14. Park S M, Kamondetdacha R, Nyenhuis J A. Calculation of MRI-induced heating of an implanted medical lead wire with an electric field transfer function. *J Magn Reson Imaging.* 2007; 26(5):1278-1285. doi:10.1002/jmri.21159.

15. ASTM standard F 2182-2002a. Standard test method for measurement of radio frequency induced heating near passive implants during magnetic resonance imaging. *ASTM Int.* 2002; (December): 1-14. doi:10.1520/F2182-11A.1.7.

16. Etezadi-Amoli M, Stang P, Kerr A, Pauly J, Scott G. Interventional device visualization with toroidal transceiver and optically coupled current sensor for radiofrequency safety monitoring. *Magn Reson Med.* 2015; 73(3): 1315-1327. doi:10.1002/mrm.25187.

The invention claimed is:

1. A method of imaging a conductive object with a parallel transmit MR scanner apparatus, comprising:
   a) determining one or more RF transmit modes that couple with a conductive object located within a subject to be imaged;
   b) determining one or more RF transmit modes that do not couple with the conductive object located within the subject to be imaged;
   c) imaging the subject by controlling the parallel transmit MR scanner to produce the determined one or more RF transmit modes that do not couple with the conductive object, wherein the determined one or more non-coupling RF transmit modes are produced at a higher power than any coupling RF transmit modes; and
   d) imaging the conductive object within the subject by inducing in the conductive object, using an RF signal, electric currents in the conductive object which in turn induce localised magnetic fields around the conductive object, the localised magnetic fields generating, when the MR scanner apparatus is operating, a detectable MR signal local to the conductive object, and controlling the MR scanner to detect the detectable MR signal.

2. A method according to claim 1, wherein a RF power level of the RF signal is such so as to prevent heating of the conductive object by the electric currents induced in the conductive object to a level that would cause damage to the tissue of the subject surrounding the conductive object.

3. A method according to claim 2, wherein the RF transmit power of the determined coupling modes is one of:
   i) 30% or less of the normal imaging signal transmit power;
   ii) 20% or less of the normal imaging signal transmit power;
   iii) between 5% and 15% of the normal imaging signal transmit power;
   iv) 10% of the normal imaging signal transmit power;
   v) 5% or less of the normal imaging signal transmit power;
   vi) 1% of the normal imaging signal transmit power; or
   vii) 1% or less of the normal imaging signal transmit power.

4. A method according to claim 1, and further comprising repeatedly alternating: i) imaging the conductive object within the subject by controlling the parallel transmit MR scanner to produce the determined one or more coupling RF transmit modes at a reduced power than normal; and ii) imaging the subject by controlling the parallel transmit MR scanner to produce the determined one or more RF transmit modes that do not couple with the conductive object.

5. A method according to claim 1, and further comprising repeatedly performing in order:
   i) determining the one or more RF transmit modes that couple with the conductive object located within the subject to be imaged;
   ii) imaging the conductive object within the subject by controlling the parallel transmit MR scanner to produce the determined one or more coupling RF transmit modes at a reduced power than normal; and
   iii) imaging the subject by controlling the parallel transmit MR scanner to produce the determined one or more RF transmit modes that do not couple with the conductive object.

6. A method according to claim 1, and further comprising determining the reduced power level for the coupling modes using an iterative power control process.

7. A method according to claim 6, wherein the iterative power control process comprises:
   incrementing the transmit power of the coupling modes and attempting to image the conductive object, the incrementing repeating until the conductive object is successfully imaged.

8. A method according to claim 1, wherein the parallel transmit MR scanner comprises N parallel transmit RF transmission elements, and wherein the determining one or more RF transmit modes that couple with a conductive object located within a subject to be imaged comprises:
   (i) transmitting a plurality of RF pulses from the N parallel transmit RF transmission elements;
   (ii) determining the electric current induced in the conductive object by the plurality of RF pulses; and
   (iii) determining the one or more RF transmit modes that couple with the conductive object in dependence on the determined electric current.

9. A method according to claim 8, wherein the determining one or more RF transmit modes that couple with a conductive object and the imaging the conductive object are performed simultaneously.

10. A parallel transmit MR scanner apparatus, comprising:
    i) a plurality of parallel transmit RF transmission elements; and
    ii) a controller, the controller being arranged to control the parallel transmit MR scanner apparatus such that in use the apparatus:
       a) determines one or more RF transmit modes that couple with a conductive object located within a subject to be imaged; and
       b) determines one or more RF transmit modes that do not couple with the conductive object located within the subject to be imaged;
       c) images the subject by controlling the parallel transmit MR scanner to produce the determined one or more RF transmit modes that do not couple with the conductive object, wherein the determined one or more non-coupling RF transmit modes are produced at a higher power than any coupling RF transmit modes; and
       d) images the conductive object within the subject by inducing in the conductive object, using an RF signal, electric currents in the conductive object which in turn induce localised magnetic fields around the conductive object, the localised magnetic fields generating, when the MR scanner apparatus is operating, a detectable MR signal local to the conductive object, and controlling the MR scanner apparatus to detect the detectable MR signal.

11. An apparatus according to claim 10, wherein a RF power level of the RF signal is such so as to prevent heating of the conductive object by the electric currents induced in the conductive object to a level that would cause damage to the tissue of the subject surrounding the conductive object.

12. An apparatus according to claim 10, the scanner being further arranged to repeatedly alternate between: i) imaging the conductive object within the subject by controlling the parallel transmit RF transmission elements to produce the determined one or more coupling RF transmit modes at a reduced power than normal; and
    ii) imaging the subject by controlling the parallel transmit RF transmission elements to produce the determined one or more RF transmit modes that do not couple with the conductive object at a normal imaging power.

13. An apparatus according to claim 10, the scanner being further arranged to repeatedly perform in order:

i) determine the one or more RF transmit modes that couple with the conductive object located within the subject to be imaged;

ii) image the conductive object within the subject by controlling the parallel transmit MR scanner to produce the determined one or more coupling RF transmit modes at a reduced power than normal; and iii) image the subject by controlling the parallel transmit MR scanner to produce the determined one or more RF transmit modes that do not couple with the conductive object.

14. An apparatus according to claim 10, the scanner being further arranged to determine the reduced power level for the coupling modes using an iterative power control process.

15. An apparatus according to claim 14, wherein the iterative power control process comprises:

incrementing the transmit power of the coupling modes and attempting to image the conductive object, the incrementing repeating until the conductive object is successfully imaged.

16. An apparatus according to claim 10, wherein the plurality of parallel transmit RF transmission elements comprises N parallel transmit RF transmission elements, and wherein the scanner is further arranged to:

(a) transmit a plurality of RF pulses from the N parallel transmit RF transmission elements;

(b) determine the electric current induced in the conductive object by the plurality RF pulses; and (c) determine the one or more RF transmit modes that couple with the conductive object in dependence on the determined electric current.

\* \* \* \* \*